United States Patent
Nishikubo

(10) Patent No.: US 8,575,823 B2
(45) Date of Patent: Nov. 5, 2013

(54) LAMINATED PIEZOELECTRIC MATERIAL, ULTRASOUND PROBE, AND ULTRASOUND DIAGNOSTIC APPARATUS

(75) Inventor: Yuichi Nishikubo, Kanagawa (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 100 days.

(21) Appl. No.: 13/437,067

(22) Filed: Apr. 2, 2012

(65) Prior Publication Data
US 2012/0256521 A1    Oct. 11, 2012

(30) Foreign Application Priority Data
Apr. 6, 2011    (JP) .................. 2011-084157

(51) Int. Cl.
    *H01L 41/08*    (2006.01)
(52) U.S. Cl.
    USPC .......................... 310/328; 310/332
(58) Field of Classification Search
    USPC .......................... 310/328, 366, 332
    See application file for complete search history.

(56) References Cited

U.S. PATENT DOCUMENTS

| | | | | |
|---|---|---|---|---|
| 4,742,264 A | * | 5/1988 | Ogawa | 310/332 |
| 4,805,057 A | * | 2/1989 | Ogawa et al. | 360/292 |
| 5,034,649 A | * | 7/1991 | Chida et al. | 310/332 |
| 5,076,314 A | * | 12/1991 | Ikehata et al. | 137/82 |
| 7,336,022 B2 | * | 2/2008 | Schuh et al. | 310/332 |

FOREIGN PATENT DOCUMENTS

| | | |
|---|---|---|
| JP | 4-211600 | 8/1992 |
| JP | 2758199 | 3/1998 |

* cited by examiner

*Primary Examiner* — Mark Budd
(74) *Attorney, Agent, or Firm* — Lucas & Mercanti, LLP

(57) ABSTRACT

A laminated piezoelectric material has a four-layered piezoelectric material and electrode layers for applying a voltage to each layer of the four-layered piezoelectric material. Each piezoelectric material has an inorganic piezoelectric material with a remanent polarization in a thickness direction. The layers are laminated so that a direction of an electric field is counter to a direction of the remanent polarization in one of the layers and the direction of the electric field coincides with the direction of the remanent polarization in the other three layers, or the direction of the electric field coincides with the direction of the remanent polarization in one of the layers and the direction of the electric field is counter to the direction of remanent polarization in the other three layers, when a voltage is applied to each piezoelectric material of the four-layered piezoelectric material via electrode layers.

5 Claims, 19 Drawing Sheets

FIG. 4

|  |  |  |  | UPPERMOST LAYER | π/2 | 3π/2 | 5π/2 | 7π/2 | 9π/2 | 11π/2 | 13π/2 | 15π/2 | 17π/2 |
|---|---|---|---|---|---|---|---|---|---|---|---|---|---|
|  |  |  | PHASE | INTERMEDIATE LAYER | 0 | π/2 | π | 3π/2 | 2π | 5π/2 | 3π | 7π/2 | 4π |
|  |  |  |  | LOWERMOST LAYER | -π/2 | -π/2 | -π/2 | -π/2 | -π/2 | -π/2 | -π/2 | -π/2 | -π/2 |
|  |  |  | ORDER |  | 1 | 2 | 3 | 4 | 5 | 6 | 7 | 8 | 9 |
| LAYER | DIRECTION OF POLARIZATION | RELATION BETWEEN DIRECTIONS OF POLARIZATION AND ELECTRIC FIELD | DIRECTION OF ELECTRIC FIELD | → |  |  |  |  |  |  |  |  |  |
| A | 2 | ← | A | B | STRAIN | 1 | -2 | 1 | 0 | 1 | -2 | 1 | 0 | 1 |
|  | 1 | ← | A | B |  | 1 | 2 | 1 | 0 | 1 | 2 | 1 | 0 | 1 |
|  |  |  |  |  | TOTAL | 2 | 0 | 2 | 0 | 2 | 0 | 2 | 0 | 2 |
| B | 2 | → | B | A | STRAIN | -1 | 2 | -1 | 0 | -1 | 2 | -1 | 0 | -1 |
|  | 1 | ← | A | B |  | 1 | 2 | 1 | 0 | 1 | 2 | 1 | 0 | 1 |
|  |  |  |  |  | TOTAL | 0 | 4 | 0 | 0 | 0 | 4 | 0 | 0 | 0 |

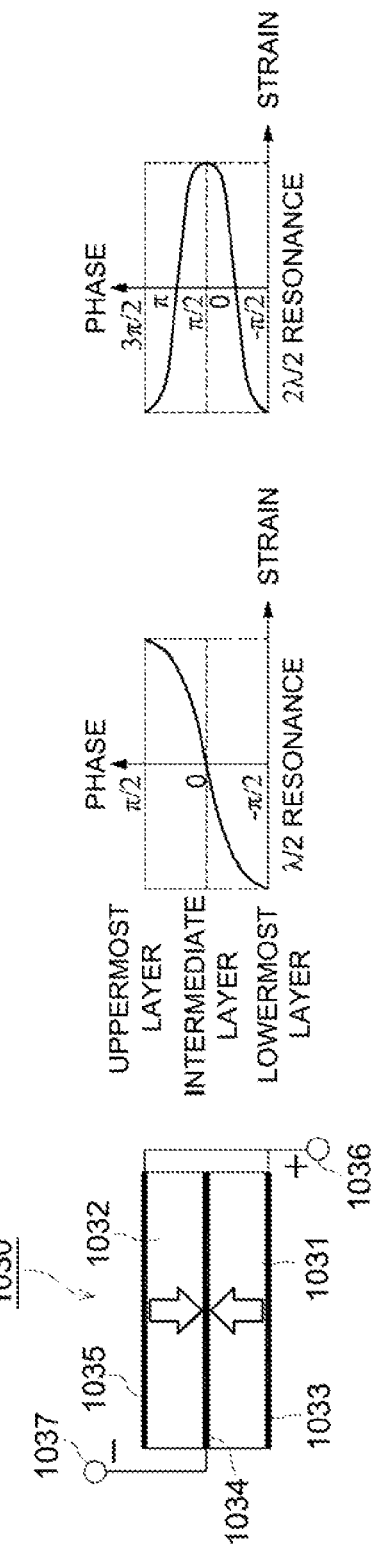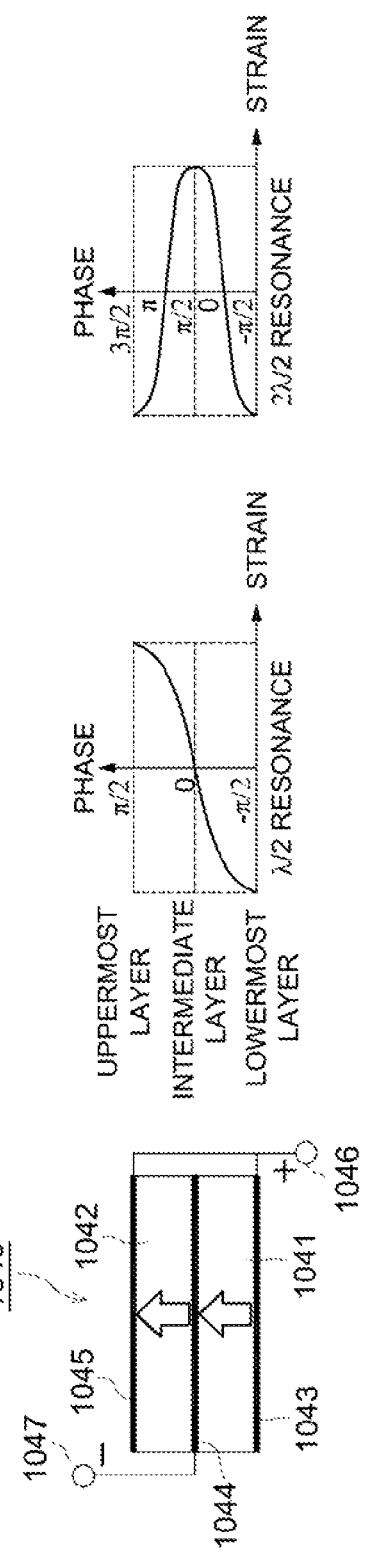
FIG. 6A
FIG. 6B

FIG. 7

| | | | | PHASE | π/2 | 3π/2 | 5π/2 | 7π/2 | 9π/2 | 11π/2 | 13π/2 | 15π/2 | 17π/2 |
|---|---|---|---|---|---|---|---|---|---|---|---|---|---|
| | | | | UPPERMOST LAYER | 0 | π/2 | π | 3π/2 | 2π | 5π/2 | 3π | 7π/2 | 4π |
| | | | | INTERMEDIATE LAYER | -π/2 | -π/2 | -π/2 | -π/2 | -π/2 | -π/2 | -π/2 | -π/2 | -π/2 |
| | | | | LOWERMOST LAYER | | | | | | | | | |
| | LAYER | DIRECTION OF POLARIZATION | RELATION BETWEEN DIRECTIONS OF POLARIZATION AND ELECTRIC FIELD | ORDER | 1 | 2 | 3 | 4 | 5 | 6 | 7 | 8 | 9 |
| | | | ← | | | | | | | | | | |
| C | 2 | → | A | STRAIN | 1 | -2 | 1 | 0 | 1 | -2 | 1 | 0 | 1 |
| | 1 | ← | A | STRAIN | 1 | 2 | 1 | 0 | 1 | 2 | 1 | 0 | 1 |
| | | | → | TOTAL | 2 | 0 | 2 | 0 | 2 | 0 | 2 | 0 | 2 |
| D | 2 | ← | B | STRAIN | -1 | 2 | -1 | 0 | -1 | 2 | -1 | 0 | -1 |
| | 1 | ← | A | STRAIN | 1 | 2 | 1 | 0 | 1 | 2 | 1 | 0 | 1 |
| | | | B | TOTAL | 0 | 4 | 0 | 0 | 0 | 4 | 0 | 0 | 0 |

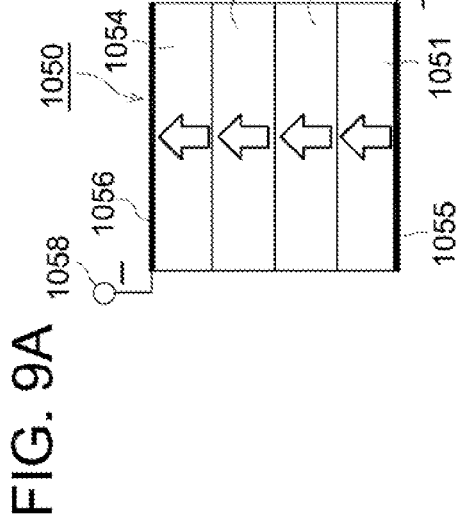
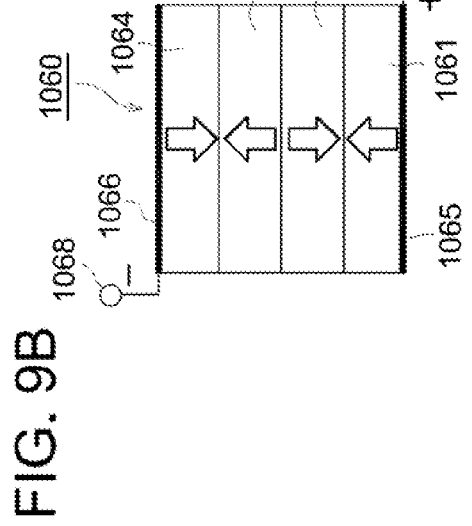

FIG. 11

| | | | UPPERMOST LAYER | π/2 | 3π/2 | 5π/2 | 7π/2 | 9π/2 | 11π/2 | 13π/2 | 15π/2 | 17π/2 |
|---|---|---|---|---|---|---|---|---|---|---|---|---|
| | | PHASE | | π/4 | 4π/4 | 7π/4 | 10π/4 | 13π/4 | 16π/4 | 19π/4 | 22π/4 | 25π/4 |
| | | | INTERMEDIATE LAYE | 0 | π/2 | 2π/2 | 3π/2 | 4π/2 | 5π/2 | 6π/2 | 7π/2 | 8π/2 |
| | | | | -π/4 | 0 | π/4 | 2π/4 | 3π/4 | 4π/4 | 5π/4 | 6π/4 | 7π/4 |
| | | | LOWERMOST LAYER | -π/2 | -π/2 | -π/2 | -π/2 | -π/2 | -π/2 | -π/2 | -π/2 | -π/2 |
| | LAYER | *1 | RELATION BETWEEN DIRECTIONS OF POLARIZATION AND ELECTRIC FIELD / DIRECTION OF ELECTRIC FIELD ↑ ↓ | ORDER | 1 | 2 | 3 | 4 | 5 | 6 | 7 | 8 | 9 |
| E | 4 | ↑ | A B | STRAIN | 0.3 | -1.0 | 1.7 | -2.0 | 1.7 | -1.0 | 0.3 | 0.0 | 0.3 |
| | 3 | ↑ | A B | | 0.7 | -1.0 | -0.7 | 2.0 | -0.7 | -1.0 | 0.7 | 0.0 | 0.7 |
| | 2 | ↑ | A B | | 0.7 | 1.0 | -0.7 | -2.0 | -0.7 | 1.0 | 0.7 | 0.0 | 0.7 |
| | 1 | ↑ | A B | | 0.3 | 1.0 | 1.7 | 2.0 | 1.7 | 1.0 | 0.3 | 0.0 | 0.3 |
| | | | | TOTAL | 2.0 | 0.0 | 2.0 | 0.0 | 2.0 | 0.0 | 2.0 | 0.0 | 2.0 |
| F | 4 | ↓ | B A | STRAIN | -0.3 | 1.0 | -1.7 | 2.0 | -1.7 | 1.0 | -0.3 | 0.0 | -0.3 |
| | 3 | ↑ | A B | | 0.7 | -1.0 | -0.7 | 2.0 | -0.7 | -1.0 | 0.7 | 0.0 | 0.7 |
| | 2 | ↓ | B A | | -0.7 | -1.0 | 0.7 | 2.0 | 0.7 | -1.0 | -0.7 | 0.0 | -0.7 |
| | 1 | ↑ | A B | | 0.3 | 1.0 | 1.7 | 2.0 | 1.7 | 1.0 | 0.3 | 0.0 | 0.3 |
| | | | | TOTAL | 0.0 | 0.0 | 0.0 | 8.0 | 0.0 | 0.0 | 0.0 | 0.0 | 0.0 |
| G | 4 | ↑ | A B | STRAIN | 0.3 | -1.0 | 1.7 | -2.0 | 1.7 | -1.0 | 0.3 | 0.0 | 0.3 |
| | 3 | ↓ | B A | | -0.7 | 1.0 | 0.7 | -2.0 | 0.7 | 1.0 | -0.7 | 0.0 | -0.7 |
| | 2 | ↓ | B A | | -0.7 | -1.0 | 0.7 | 2.0 | 0.7 | -1.0 | -0.7 | 0.0 | -0.7 |
| | 1 | ↑ | A B | | 0.3 | 1.0 | 1.7 | 2.0 | 1.7 | 1.0 | 0.3 | 0.0 | 0.3 |
| | | | | TOTAL | 0.8 | 0.0 | 4.8 | 0.0 | 4.8 | 0.0 | 0.8 | 0.0 | 0.8 |
| H | 4 | ↓ | B A | STRAIN | -0.3 | 1.0 | -1.7 | 2.0 | -1.7 | 1.0 | -0.3 | 0.0 | -0.3 |
| | 3 | ↓ | B A | | -0.7 | 1.0 | 0.7 | -2.0 | 0.7 | 1.0 | -0.7 | 0.0 | -0.7 |
| | 2 | ↑ | A B | | 0.7 | 1.0 | -0.7 | -2.0 | -0.7 | 1.0 | 0.7 | 0.0 | 0.7 |
| | 1 | ↑ | A B | | 0.3 | 1.0 | 1.7 | 2.0 | 1.7 | 1.0 | 0.3 | 0.0 | 0.3 |
| | | | | TOTAL | 0.0 | 4.0 | 0.0 | 0.0 | 0.0 | 4.0 | 0.0 | 0.0 | 0.0 |
| I | 4 | ↑ | A B | STRAIN | 0.3 | -1.0 | 1.7 | -2.0 | 1.7 | -1.0 | 0.3 | 0.0 | 0.3 |
| | 3 | ↑ | A B | | 0.7 | -1.0 | -0.7 | 2.0 | -0.7 | -1.0 | 0.7 | 0.0 | 0.7 |
| | 2 | ↓ | B A | | -0.7 | -1.0 | 0.7 | 2.0 | 0.7 | -1.0 | -0.7 | 0.0 | -0.7 |
| | 1 | ↑ | A B | | 0.3 | 1.0 | 1.7 | 2.0 | 1.7 | 1.0 | 0.3 | 0.0 | 0.3 |
| | | | | TOTAL | 0.6 | 2.0 | 3.4 | 4.0 | 3.4 | 2.0 | 0.6 | 0.0 | 0.6 |
| J | 4 | ↑ | A B | STRAIN | 0.3 | -1.0 | 1.7 | -2.0 | 1.7 | -1.0 | 0.3 | 0.0 | 0.3 |
| | 3 | ↓ | B A | | -0.7 | 1.0 | 0.7 | -2.0 | 0.7 | 1.0 | -0.7 | 0.0 | -0.7 |
| | 2 | ↑ | A B | | 0.7 | 1.0 | -0.7 | -2.0 | -0.7 | 1.0 | 0.7 | 0.0 | 0.7 |
| | 1 | ↑ | A B | | 0.3 | 1.0 | 1.7 | 2.0 | 1.7 | 1.0 | 0.3 | 0.0 | 0.3 |
| | | | | TOTAL | 0.6 | 2.0 | 3.4 | 4.0 | 3.4 | 2.0 | 0.6 | 0.0 | 0.6 |
| K | 4 | ↓ | B A | STRAIN | -0.3 | 1.0 | -1.7 | 2.0 | -1.7 | 1.0 | -0.3 | 0.0 | -0.3 |
| | 3 | ↑ | A B | | 0.7 | -1.0 | -0.7 | 2.0 | -0.7 | -1.0 | 0.7 | 0.0 | 0.7 |
| | 2 | ↑ | A B | | 0.7 | 1.0 | -0.7 | -2.0 | -0.7 | 1.0 | 0.7 | 0.0 | 0.7 |
| | 1 | ↑ | A B | | 0.3 | 1.0 | 1.7 | 2.0 | 1.7 | 1.0 | 0.3 | 0.0 | 0.3 |
| | | | | TOTAL | 1.4 | 2.0 | 1.4 | 4.0 | 1.4 | 2.0 | 1.4 | 0.0 | 1.4 |
| L | 4 | ↓ | B A | STRAIN | -0.3 | 1.0 | -1.7 | 2.0 | -1.7 | 1.0 | -0.3 | 0.0 | -0.3 |
| | 3 | ↓ | B A | | -0.7 | 1.0 | 0.7 | -2.0 | 0.7 | 1.0 | -0.7 | 0.0 | -0.7 |
| | 2 | ↓ | B A | | -0.7 | -1.0 | 0.7 | 2.0 | 0.7 | -1.0 | -0.7 | 0.0 | -0.7 |
| | 1 | ↑ | A B | | 0.3 | 1.0 | 1.7 | 2.0 | 1.7 | 1.0 | 0.3 | 0.0 | 0.3 |
| | | | | TOTAL | 1.4 | 2.0 | 1.4 | 4.0 | 1.4 | 2.0 | 1.4 | 0.0 | 1.4 |

*1: DIRECTION OF POLARIZATION

FIG. 16

| | | | | PHASE | UPPERMOST LAYER | π/2 | 3π/2 | 5π/2 | 7π/2 | 9π/2 | 11π/2 | 13π/2 | 15π/2 | 17π/2 |
|---|---|---|---|---|---|---|---|---|---|---|---|---|---|---|
| | | | | | | π/4 | 4π/4 | 7π/4 | 10π/4 | 13π/4 | 16π/4 | 19π/4 | 22π/4 | 25π/4 |
| | | | | | INTERMEDIATE LAYE | 0 | π/2 | 2π/2 | 3π/2 | 4π/2 | 5π/2 | 6π/2 | 7π/2 | 8π/2 |
| | | | | | | -π/4 | 0 | π/4 | 2π/4 | 3π/4 | 4π/4 | 5π/4 | 6π/4 | 7π/4 |
| | | | | | LOWERMOST LAYER | -π/2 | -π/2 | -π/2 | -π/2 | -π/2 | -π/2 | -π/2 | -π/2 | -π/2 |
| | LAYER | *1 | RELATION BETWEEN DIRECTIONS OF POLARIZATION AND ELECTRIC FIELD | | ORDER | 1 | 2 | 3 | 4 | 5 | 6 | 7 | 8 | 9 |
| | | | DIRECTION OF ELECTRIC FIELD ↑ ↓ | | | | | | | | | | | |
| M | 4 | ↑ | A | B | STRAIN | -0.3 | 1.0 | -1.7 | 2.0 | -1.7 | 1.0 | -0.3 | 0.0 | -0.3 |
| | 3 | ↑ | B | A | | 0.7 | -1.0 | -0.7 | 2.0 | -0.7 | -1.0 | 0.7 | 0.0 | 0.7 |
| | 2 | ↑ | A | B | | -0.7 | -1.0 | 0.7 | 2.0 | 0.7 | -1.0 | -0.7 | 0.0 | -0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 0.0 | 0.0 | 0.0 | 8.0 | 0.0 | 0.0 | 0.0 | 0.0 | 0.0 |
| N | 4 | ↓ | B | A | STRAIN | 0.3 | -1.0 | 1.7 | -2.0 | 1.7 | -1.0 | 0.3 | 0.0 | 0.3 |
| | 3 | ↑ | B | A | | 0.7 | -1.0 | -0.7 | 2.0 | -0.7 | -1.0 | 0.7 | 0.0 | 0.7 |
| | 2 | ↓ | B | A | | 0.7 | 1.0 | -0.7 | -2.0 | -0.7 | 1.0 | 0.7 | 0.0 | 0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 2.0 | 0.0 | 2.0 | 0.0 | 2.0 | 0.0 | 2.0 | 0.0 | 2.0 |
| O | 4 | ↑ | A | B | STRAIN | -0.3 | 1.0 | -1.7 | 2.0 | -1.7 | 1.0 | -0.3 | 0.0 | -0.3 |
| | 3 | ↓ | A | B | | -0.7 | 1.0 | 0.7 | -2.0 | 0.7 | 1.0 | -0.7 | 0.0 | -0.7 |
| | 2 | ↓ | B | A | | 0.7 | 1.0 | -0.7 | -2.0 | -0.7 | 1.0 | 0.7 | 0.0 | 0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 0.0 | 4.0 | 0.0 | 0.0 | 0.0 | 4.0 | 0.0 | 0.0 | 0.0 |
| P | 4 | ↓ | B | A | STRAIN | 0.3 | -1.0 | 1.7 | -2.0 | 1.7 | -1.0 | 0.3 | 0.0 | 0.3 |
| | 3 | ↓ | A | B | | -0.7 | 1.0 | 0.7 | -2.0 | 0.7 | 1.0 | -0.7 | 0.0 | -0.7 |
| | 2 | ↑ | A | B | | -0.7 | -1.0 | 0.7 | 2.0 | 0.7 | -1.0 | -0.7 | 0.0 | -0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 0.8 | 0.0 | 4.8 | 0.0 | 4.8 | 0.0 | 0.8 | 0.0 | 0.8 |
| Q | 4 | ↑ | A | B | STRAIN | -0.3 | 1.0 | -1.7 | 2.0 | -1.7 | 1.0 | -0.3 | 0.0 | -0.3 |
| | 3 | ↑ | B | A | | 0.7 | -1.0 | -0.7 | 2.0 | -0.7 | -1.0 | 0.7 | 0.0 | 0.7 |
| | 2 | ↓ | B | A | | 0.7 | 1.0 | -0.7 | -2.0 | -0.7 | 1.0 | 0.7 | 0.0 | 0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 1.4 | 2.0 | 1.4 | 4.0 | 1.4 | 2.0 | 1.4 | 0.0 | 1.4 |
| R | 4 | ↑ | A | B | STRAIN | -0.3 | 1.0 | -1.7 | 2.0 | -1.7 | 1.0 | -0.3 | 0.0 | -0.3 |
| | 3 | ↓ | A | B | | -0.7 | 1.0 | 0.7 | -2.0 | 0.7 | 1.0 | -0.7 | 0.0 | -0.7 |
| | 2 | ↑ | A | B | | -0.7 | -1.0 | 0.7 | 2.0 | 0.7 | -1.0 | -0.7 | 0.0 | -0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 1.4 | 2.0 | 1.4 | 4.0 | 1.4 | 2.0 | 1.4 | 0.0 | 1.4 |
| S | 4 | ↓ | B | A | STRAIN | 0.3 | -1.0 | 1.7 | -2.0 | 1.7 | -1.0 | 0.3 | 0.0 | 0.3 |
| | 3 | ↑ | B | A | | 0.7 | -1.0 | -0.7 | 2.0 | -0.7 | -1.0 | 0.7 | 0.0 | 0.7 |
| | 2 | ↑ | A | B | | -0.7 | -1.0 | 0.7 | 2.0 | 0.7 | -1.0 | -0.7 | 0.0 | -0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 0.6 | 2.0 | 3.4 | 4.0 | 3.4 | 2.0 | 0.6 | 0.0 | 0.6 |
| T | 4 | ↓ | B | A | STRAIN | 0.3 | -1.0 | 1.7 | -2.0 | 1.7 | -1.0 | 0.3 | 0.0 | 0.3 |
| | 3 | ↓ | A | B | | -0.7 | 1.0 | 0.7 | -2.0 | 0.7 | 1.0 | -0.7 | 0.0 | -0.7 |
| | 2 | ↓ | B | A | | 0.7 | 1.0 | -0.7 | -2.0 | -0.7 | 1.0 | 0.7 | 0.0 | 0.7 |
| | 1 | ↑ | B | A | | 0.3 | 1.0 | 1.7 | 2.0 | 1.7 | 1.0 | 0.3 | 0.0 | 0.3 |
| | | | | | TOTAL | 0.6 | 2.0 | 3.4 | 4.0 | 3.4 | 2.0 | 0.6 | 0.0 | 0.6 |

*1: DIRECTION OF POLARIZATION

LAMINATED PIEZOELECTRIC MATERIAL, ULTRASOUND PROBE, AND ULTRASOUND DIAGNOSTIC APPARATUS

This application is based on Japanese Patent Application No. 2011-084157 filed on Apr. 6, 2011 in Japan Patent Office, the entire content of which is hereby incorporated by reference.

FIELD OF THE INVENTION

The present invention relates to a laminated piezoelectric material, an ultrasound probe, and an ultrasound diagnostic apparatus.

TECHNICAL BACKGROUND

Generally, many piezoelectric materials having inorganic piezoelectric materials as principal component such as PZT (lead zirconate titanate) are used for ultrasound transducers, which output ultrasound by resonance with given electric signal having predetermined resonance frequency. Moreover, this ultrasound transducer can convert a reflective wave of the outputted ultrasound into an electric signal in case of receiving the reflective wave. Such an ultrasound transducer is used in equipments such as medical ultrasound diagnostic apparatus, ultrasound-crack-inspect equipment and sonar. In recent years, required is image with high resolution in such equipment, in order to enhance diagnostic value.

In view of the foregoing, in order to attain high-frequency and high sensitivity of an ultrasound transducer, hitherto there is an ultrasound transducer formed by laminating two or more piezoelectric materials. This ultrasound transducer may be called a laminated piezoelectric material. Adjacent two piezoelectric materials in the laminated piezoelectric material are laminated so that each piezoelectric material mutually has reverse direction of polarization and electrodes are formed on the both-ends side of the lamination direction (for example, Patent Document 1). Both-ends side serves as an "anti-node" of vibration, and the laminated piezoelectric material is constituted to have $m\lambda/2$ (m is positive integer) resonance (for example, Patent Document 2).

PRIOR TECHNICAL DOCUMENT

Patent Document

Patent Document 1: Examined Japanese Patent Application Publication No. 2758199
Patent Document 2: Unexamined Japanese Patent Application Publication (hereinafter referred to as JP-A) No. 4-211600.

SUMMARY

Although the sensitivity in a high frequency component is reinforced with the technology described in each above-mentioned patent documents, such an effect is limited to the specific frequency band. That is, since the amount of strains of each piezoelectric material will negate each other around such a specific frequency band, whereby resonance will no longer be obtained, and sensitivity will fall. Therefore, the frequency band which can be used is restrictive and is not practical. In recent years, in order to improve sensitivity, the laminated piezoelectric material which laminated the piezoelectric material to four layers is used. However when the piezoelectric material is laminated by the technology described in the above-mentioned patent document 1, the problem mentioned above becomes remarkable.

The object of the present invention is to provide a laminated piezoelectric material, an ultrasound probe and an ultrasound diagnostic apparatus which can utilize a wide band frequency, as well as enhancing sensitivity in a high frequency component.

In order to achieve at least one object mentioned above, according to a first aspect of the present invention, there is provided a laminated piezoelectric material that comprises a four-layered piezoelectric material and electrode layers for applying a voltage to each layer of the four-layered piezoelectric material, wherein each piezoelectric material of the four-layered piezoelectric material comprises an inorganic piezoelectric material as a principal component and has a remanent polarization in a thickness direction, and the layer of the four-layered piezoelectric material is laminated so that a direction of an electric field counters to a direction of the remanent polarization in only one of the piezoelectric material of the four-layered piezoelectric material and the direction of the electric field coincides with the direction of the remanent polarization in other three layers, or the direction of the electric field coincides with the direction of the remanent polarization in only one of the piezoelectric material of the four-layered piezoelectric material and the direction of the electric field counters to the direction of the remanent polarization in other three layers, when the voltage is applied to each piezoelectric material of the four-layered piezoelectric material via the electrode layers.

According to a second aspect of the present invention, there is provided the laminated piezoelectric material that comprises integral multiple of the four-layered piezoelectric material of claim 1 which has the relation between the direction of the electric field and the direction of the remanent polarization.

According to a third aspect of the present invention, there is provided the laminated piezoelectric material of the first aspect that constitutes so that the piezoelectric material of each layer is connected in parallel electrically.

According to a fourth aspect of the present invention, there is provided an ultrasound probe that comprises the laminated piezoelectric material of the first aspect, wherein the laminated piezoelectric material transmits transmission ultrasound wave towards a test object for applying a voltage to the laminated piezoelectric material, and receives a reflective ultrasound wave from the test objet and changes into an electric signal.

According to a fifth aspect of the present invention, there is provided an ultrasound diagnostic apparatus that comprises
the ultrasound probe of the fourth aspect,
a transmission unit which transmits a transmission signal to the ultrasound probe by applying the voltage to the laminated piezoelectric material,
a reception unit which receives an electric signal converted by the ultrasound probe as a reception signal,
an image generation unit which generates an ultrasound image data based on the reception signal received by the reception unit, and
a display unit which displays the ultrasound image based on the ultrasound image data generated by the image generation unit.

According to this invention, a laminated piezoelectric material, an ultrasound probe and an ultrasound diagnostic apparatus can be provided which can enhance sensitivity in a high frequency component and utilize a wide band frequency.

BRIEF DESCRIPTION OF THE DRAWING

FIG. 4 is a figure which explains the relation between the directions of polarization and electric field and the amount of strains of a laminated piezoelectric material for every resonance order.

FIGS. 6A and 6B each is a figure explaining the relation between the directions of polarization and electric field in a two-layer laminated piezoelectric material and the amount of strains of a laminated piezoelectric material.

FIG. 7 is a figure which explains the relation between the directions of polarization and electric field and the amount of strains of a laminated piezoelectric material for every resonance order.

FIGS. 9A and 9B each is a figure explaining the relation between the directions of polarization and electric field in a four-layered laminated piezoelectric material and the amount of strains of a laminated piezoelectric material.

FIG. 11 is a figure which explains the relation between the directions of polarization and electric field and the amount of strains of a laminated piezoelectric material for every resonance order.

FIG. 16 is a figure which explains the relation between the directions of polarization and electric field and the amount of strains of a laminated piezoelectric material for every resonance order.

Hereafter, the embodiment of the present invention is described with reference to a drawing. However, the range of the invention is not limited to the example of illustration. Herein, what has the same function and constitution is represented by the same mark and the explanation is omitted.

Figure 1:
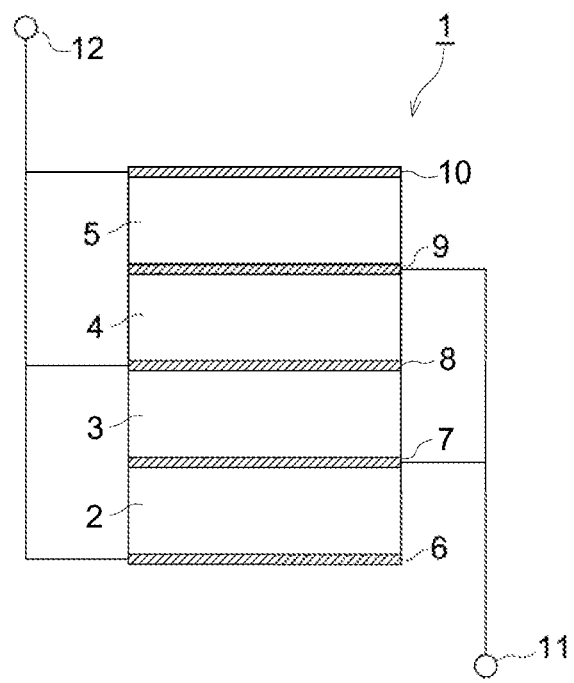
FIG. 1 is a sectional view showing the schematic constitution of the laminated piezoelectric material according to the present embodiment.
Figure 2:
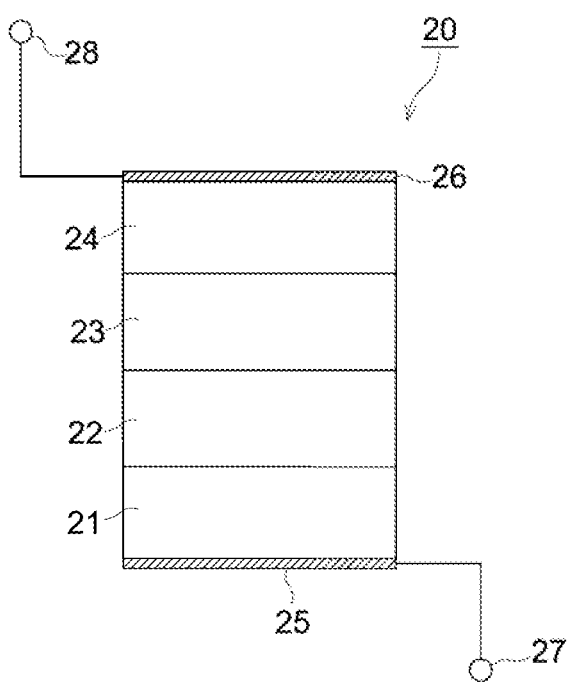
FIG. 2 is a sectional view showing the schematic constitution of the laminated piezoelectric material according to the present embodiment.

First, the laminated piezoelectric material according to the present embodiment is explained, referring to FIGS. 1 and 2. FIG. 1 shows a laminated piezoelectric material constituted by four layer laminated piezoelectric material connected in parallel electrically. FIG. 2 shows a laminated piezoelectric material constituted by four layers laminated piezoelectric material connected in series electrically. In the present embodiment, the laminated piezoelectric materials shown in any of FIGS. 1 and 2 are applicable.

As shown in FIG. 1, the laminated piezoelectric material 1 is constituted by the laminated four piezoelectric materials 2-5 in the thickness direction which are connected in parallel electrically.

The piezoelectric materials 2-5 are constituted by inorganic piezoelectric materials which comprise an inorganic piezoelectric material as a principal component. Inorganic piezoelectric materials applicable to the present embodiment include: thin film of crystal, piezo ceramics PZT, PLZT, piezoelectric single crystal PZN-PT, PMN-PT, $LiTaO_3$, $KNbO_3$, ZnO, and AlN. In addition, composite piezoelectric materials may be applicable which comprise inorganic piezoelectric material in combination with organic polymer material. Moreover, components other than an inorganic piezoelectric material may be contained as long as an inorganic piezoelectric material is included as a principal component. In the present embodiment, the piezoelectric materials 2-5 each are constituted by the piezoelectric ceramics made of PZT as a principal component, respectively.

Piezoelectric materials 2-5 each are subjected to be polarized by poling treatment, whereby piezoelectric materials 2-5 each have remanent polarization in the any one direction of the thickness direction respectively. In the present embodiment, with respect to a direction of an electric field generated by applied voltage and a direction of the remanent polarization, directions of remanent polarizations of piezoelectric materials 2-5 are arranged so that the direction of the electric field and the direction of the remanent polarization counters or coincides in only one of the piezoelectric material of the piezoelectric materials 2-5. Reason for arranging remanent polarization as above will be described later.

The piezoelectric materials 2-5 each is subjected to have the same thickness. In order to extend further the band frequency of the ultrasound wave transmission and reception, thickness of the piezoelectric materials 2-5 each may not be the same, but may be different respectively. That is, in consideration of the wavelength of the vibration in the laminated piezoelectric material 1, the thickness of the piezoelectric material each may be arranged respectively so that the positions of the interface of a piezoelectric material may be shifted from an "anti-node" and a "node" of vibration. For example, between the adjacent piezoelectric materials, the thickness can be changed about 20 to 25%.

The electrode layers 6-10 each are arranged at the both-ends side and interface of the laminated piezoelectric materials 2-5. The electrode layers 6-10 are united with the piezoelectric materials 2-5 by calcination, vacuum deposition, or sputtering, for example. A material applicable to an electrode layer includes Ag—Pd paste, gold, silver, copper, platinum, nickel, chromium, and alloys thereof. The electrode layers 7 and 9 are connected to a terminal 11, respectively, and the electrode layers 6, 8, and 10 are connected to a terminal 12, respectively.

Terminals 11 and 12 are connected to the voltage generator which outputs the drive voltage of predetermined frequency, respectively.

Since both ends are free ends, the laminated piezoelectric material 1 constituted in this way resonates in $m\lambda/2$ (m is positive integer) resonance mode. Basic resonance frequency f(0) of the laminated piezoelectric material 1 can be calculated by Expression (1). In Expression (1), v represents an acoustic velocity and h represents the thickness of the laminated piezoelectric material. Herein, the thickness of an electrode layer is not taken into consideration. $f(0)=v/2h \ldots (1)$ When voltage is applied and excited to the laminated piezoelectric material 1 constituted in this way, each piezoelectric materials 2-5 will expand and contract in synchronization. As a result, the laminated piezoelectric material 1 generate resonance which serves an "anti-node" and a "node" of vibration at both-ends side or an interface of the laminated piezoelectric material 1, respectively.

As shown in FIG. 2, the laminated piezoelectric material 20 is constituted by the laminated four piezoelectric materials 21-24 in the thickness direction which are connected in series electrically. Since components, directions of the polarization and thickness in the piezoelectric materials 21-24 each are the same as those of the laminated piezoelectric material 1 shown in FIG. 1 and described above, whereby explanation is omitted.

The laminated piezoelectric material 20 has the electrode layers 25 and 26 each are arranged at the both-ends side of the piezoelectric materials 21-24. The electrode layer 25 is connected to a terminal 27 and the electrode layer 26 is connected to a terminal 28, respectively.

Terminals 27 and 28 are connected to the voltage generator which outputs the drive voltage of predetermined frequency, respectively.

The laminated piezoelectric material 20 constituted in this way can generate resonance as same as the laminated piezoelectric material 1 mentioned above having four piezoelectric materials in parallel connection electrically.

Herein, the relation will be explained between directions of remanent polarization and direction of electric field for every piezoelectric layer, and the amount of strains of a laminated piezoelectric material.

Figure 3A:
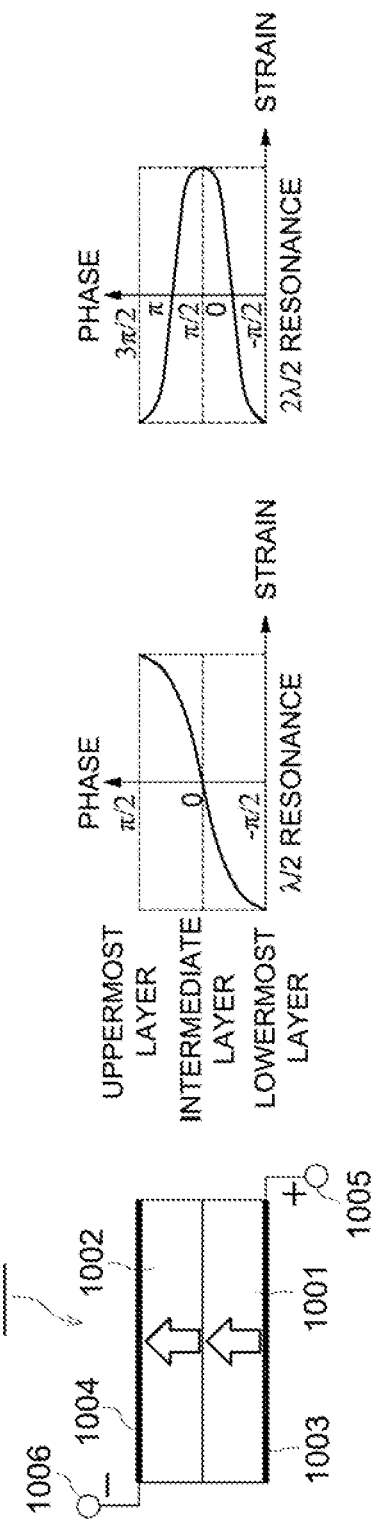
FIGS. 3A and 3B each is a figure explaining the relation between the directions of polarization and electric field in a two-layer laminated piezoelectric material and the amount of strains of a laminated piezoelectric material.
Figure 3B:
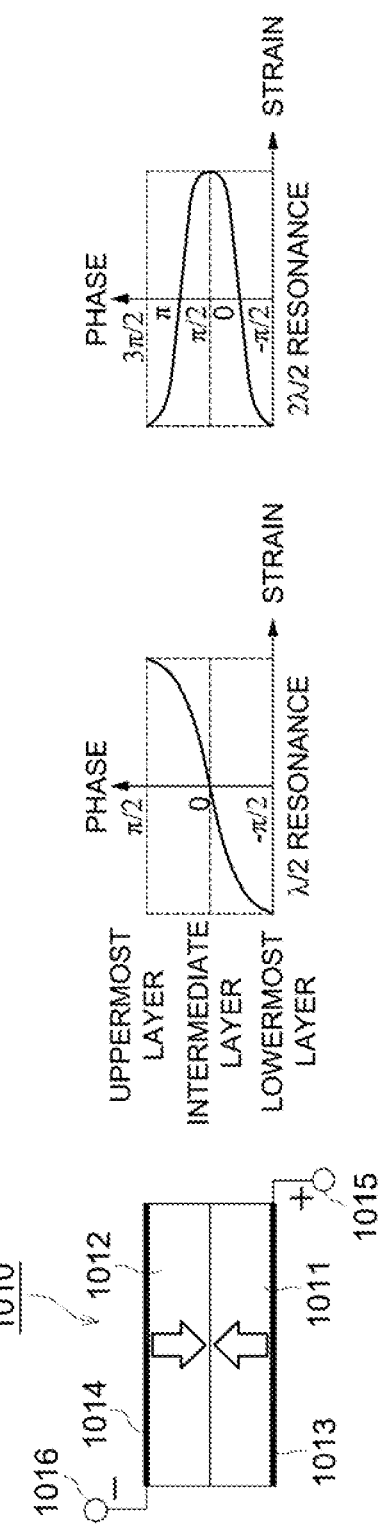

First, with reference to FIG. 3, explained is an example of a laminated piezoelectric material laminated by two piezoelectric materials in series connection. As shown in FIG. 3 (A), piezoelectric materials 1001 and 1002 in the laminated piezoelectric material 1000 having series connection of the two piezoelectric materials are subjected to have the same direction of remanent polarizations (hereinafter also refers to as direction of polarization). That is, as for any piezoelectric materials 1001 and 1002, the direction of polarization is subjected towards the upper layer from the lower layer. Hereinafter, an arrow shown on the piezoelectric material in figures represents a direction of remanent polarization. With respect to a laminated piezoelectric material 1000, voltage is applied through terminals 1005 and 1006 with the polarity of the voltage in the electrode layer 1003 being positive and in the electrode layer 1004 being negative. In the case of resonate by $\lambda/2$ resonance mode and $2\lambda/2$ resonance mode, transition of each amount of strains is shown in FIG. 3 (A). Herein, $\lambda/2$ resonance mode is the mode which resonates a laminated piezoelectric material with the basic resonance frequency drawn by the thickness of the whole laminated piezoelectric material and $2\lambda/2$ resonance mode is the modes which resonates a laminated piezoelectric material with twice the basic resonance frequency (secondary resonance). In the example shown in FIG. 3 (A), the direction of electric field coincides with the direction of polarization also in the piezoelectric materials 1001 and 1002 in any layers. Therefore, the following Expression can express the amount of strains S1 and S2 in the piezoelectric materials 1001 and 1002 of each layer in case of resonance by $2\lambda/2$ resonance mode. $S1=\sin 0-\sin(\pi/2)=1 \ldots (2)$, $S2=\sin \pi/2-\sin 0=1 \ldots (3)$, (hereinafter the amount of strain of a piezoelectric material is represented by relative value based on S1 and S2 each being strains of the piezoelectric material 1001 and 1002 being referred to as 1). Since the piezoelectric materials 1001 and 1002 of each layer are therefore distorted in phase, the amount of strains of the whole laminated piezoelectric material 1000 is $S1+S2=2 \ldots (4)$, and results in a resonance of the laminated piezoelectric material 1000 amplified by twice as amount of strains.

Moreover, the following Expression can express the amount of strains S3 and S4 in the piezoelectric materials 1001 and 1002 of each layer in case of resonance by $2\lambda/2$ resonance mode. $S3=\sin \pi/2-\sin(-\pi/2)=2 \ldots (5)$, $S4=\sin 3\pi/2-\sin \pi/2=-2 \ldots (6)$. Therefore, since the piezoelectric materials 1001 and 1002 of each layer are distorted by reverse phase, the whole amount of strains of the laminated piezoelectric material 1000 is $S3+S4=0 \ldots (7)$, the amount of strains of each layer is balanced, and resonance of the laminated piezoelectric material 1000 disappears.

The amount of strains of the laminated piezoelectric material 1000 whole can be similarly calculated in case of $3\pi/2$ or more resonance modes.

On the other hand, in the example shown in FIG. 3 (B), piezoelectric materials 1011 and 1012 in the laminated piezoelectric material 1010 having series connection of the two piezoelectric materials are subjected to have the opposite direction of remanent polarizations. With respect to a laminated piezoelectric material 1010, voltage is applied through terminals 1015 and 1016 with the polarity of the voltage in the electrode layer 1013 being positive and in the electrode layer 1014 being negative. In the case of resonate by $2\lambda/2$ resonance mode and $2\lambda/2$ resonance mode, transition of each amount of strains is shown in FIG. 3 (B). Herein, as for piezoelectric material 1011, the direction of electric field coincides with direction of polarization, but as for piezoelectric material 1012, the direction of electric field counters with direction of polarization. Therefore, the following Expression can express the amount of strains S5 and S6 in the piezoelectric materials 1011 and 1012 of each layer in case of resonance by $\lambda/2$ resonance mode. $S5=\sin 0-\sin(-\pi/2)=1 \ldots (8)$, $S6=-(\sin \pi/2-\sin 0)=-1 \ldots (9)$. Since the piezoelectric materials 1011 and 1012 of each layer are therefore distorted in reverse phase, the amount of strains of the whole laminated piezoelectric material 1010 is $S5+S6=0 \ldots (10)$, and resonance of the laminated piezoelectric material 1010 is balanced, and resonance of the laminated piezoelectric material 1010 disappears.

Moreover, the following Expression can express the amount of strains S7 and S8 in the piezoelectric materials 1011 and 1012 of each layer in case of resonance by $2\lambda/2$ resonance mode. $S7=\sin \pi/2-\sin(-\pi/2)=2 \ldots (11)$, $S8=-(\sin 3\pi/2-\sin \pi/2)=2 \ldots (12)$. Therefore, since the piezoelectric materials 1011 and 1012 of each layer are distorted in phase, the whole amount of strains of the laminated piezoelectric material 1010 is S8+S9=4 ... (13), resonance of the laminated piezoelectric material 1010 is amplified by four times as amount of strains.

The amount of strains of the whole laminated piezoelectric material 1010 can be similarly calculated in case of $3\pi/2$ or more resonance modes.

With respect to the laminated piezoelectric material in which two piezoelectric materials are laminated and connected series electrically, the table in FIG. 4 can represent the relation between the direction of polarization of a laminated piezoelectric material and the direction of the electric field and the amount of strains of the whole laminated piezoelectric material as determined above. In FIG. 4, "A" shows the relation in which the direction of the polarization coincides with the direction of the electric field, and "B" shows the relation in which the direction of the polarization counters to the direction of the electric field. Herein, since the polarity of the applied voltage changes periodically, the direction of the electric field also changes periodically. Therefore, it changes periodically also about the relation between the direction of the electric field and the direction of the polarization. Moreover, even when the direction of the polarization of each piezoelectric material in each pattern shown in FIG. 4 is reversed respectively, the same result can be obtained as shown in the second column of Relation between Directions of polarization and electric field which is the same result shown in the first column of Relation between Directions of polarization and electric field in FIG. 4. The result plotted for every pattern about the relation between a resonance order and the amount of strains of the whole laminated piezoelectric material is shown in FIG. 5.

Figure 5:
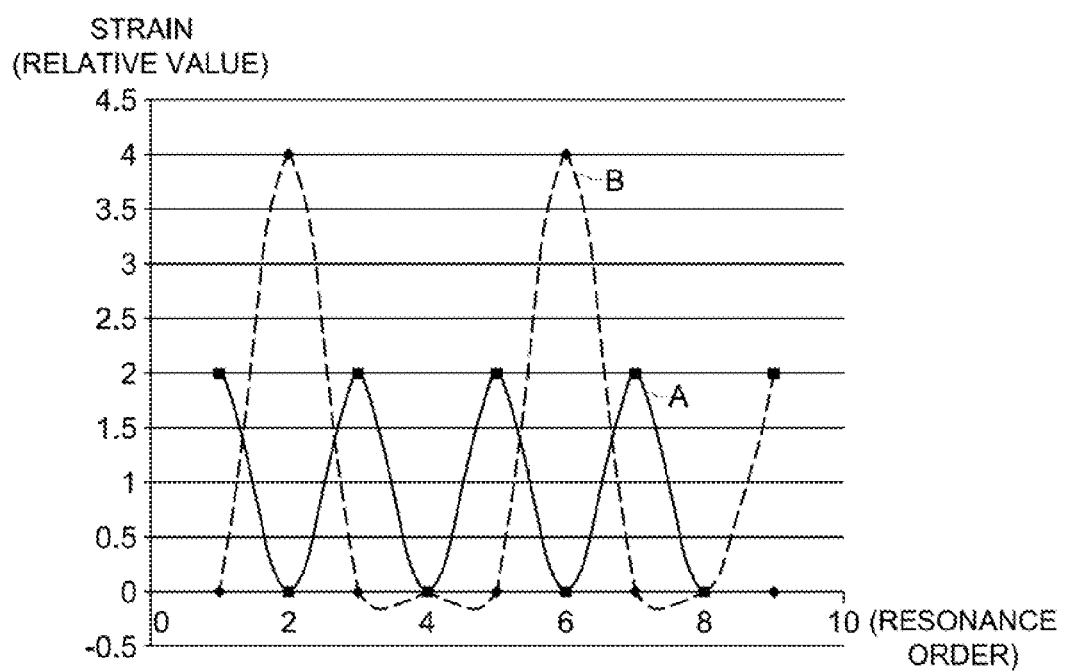
FIG. 5 is a graph showing the relation between a resonance order and the amount of strains of a laminated piezoelectric material.

As shown in FIGS. 4 and 5, in the case of Pattern A, while the resonance having twice amount of strains of a laminated piezoelectric material is seen in the odd resonance order, however, resonance of a laminated piezoelectric material is not seen in the even resonance order. Moreover, in the case of Pattern B, when the resonance frequency is the twice (secondary resonance) and 6 times (6th resonance) of basic resonance frequency, the resonance having 4 times of amount of strains of a laminated piezoelectric material is seen. However, resonance of a laminated piezoelectric material is not seen in other orders.

As described above, in any of Pattern A and Pattern B, high sensitivity can be obtained in a high order frequency. However, since the amount of strains of each piezoelectric material is balanced between peaks, whereby the resonance of the whole laminated piezoelectric material is no longer obtained, and there exists the frequency band which cannot be utilized.

Next, with reference to FIG. 6, explained is an example of a laminated piezoelectric material laminated by two piezoelectric materials in parallel connection. As shown in FIG. 6 (A), piezoelectric materials 1031 and 1032 in the laminated piezoelectric material 1030 having parallel connection of the two piezoelectric materials are subjected to have the reverse direction of polarizations. That is, as for the piezoelectric material 1031, the direction of polarization is subjected towards the upper layer from the lower layer, and as for the piezoelectric material 1032, the direction of polarization is subjected towards the lower layer from the upper layer. With respect to a laminated piezoelectric material 1030, voltage is applied through terminals 1036 and 1037 with the polarity of the voltage in the electrode layers 1033 and 1035 being positive and in the electrode layer 1034 being negative. In the case of resonate by $\lambda/2$ resonance mode and $2\lambda/2$ resonance mode, transition of each amount of strains is shown in FIG. 6 (A). The direction of electric field coincides with the direction of polarization also in the piezoelectric materials 1031 and 1032 in any layers. Therefore, the following Expression can express the amount of strains S9 and S10 in the piezoelectric materials 1031 and 1032 of each layer in case of resonance by $\lambda/2$ resonance mode. S9=sin 0−sin (−$\pi/2$)=1 ... (14), S10=sin $\pi/2$−sin 0=1 ... (15). Since the piezoelectric materials 1031 and 1032 of each layer are therefore distorted in phase, the amount of strains of the whole laminated piezoelectric material 1030 is S9+S10=2 ... (16), and the resonance of the laminated piezoelectric material 1030 is amplified by twice as amount of strains.

Moreover, the following Expression can express the amount of strains S11 and S12 in the piezoelectric materials 1031 and 1032 of each layer in case of resonance by $2\lambda/2$ resonance mode. S11=sin $\pi/2$−sin (−$\pi/2$)=2 ... (17), S12=sin $3\pi/2$−sin $\pi/2$=−2 ... (18). Therefore, since the piezoelectric materials 1031 and 1032 of each layer are distorted by reverse phase, the whole amount of strains of the laminated piezoelectric material 1030 is S11+S12=0 ... (19), the amount of strains of each layer is balanced, and resonance of the laminated piezoelectric material 1030 disappears.

The amount of strains of the laminated piezoelectric material 1030 whole can be similarly calculated in case of $3\pi/2$ or more resonance modes.

On the other hand, in the example shown in FIG. 6 (B), piezoelectric materials 1041 and 1042 in the laminated piezoelectric material 1040 are subjected to have the same direction of polarizations. That is, as for both piezoelectric materials 1041 and 1042, the direction of polarization is subjected towards the upper layer from the lower layer. With respect to a laminated piezoelectric material 1040, voltage is applied through terminals 1046 and 1047 with the polarity of the voltage in the electrode layers 1043 and 1045 being positive and in the electrode layer 1044 being negative. In the case of resonate by $\lambda/2$ resonance mode and $2\lambda/2$ resonance mode, transition of each amount of strains is shown in FIG. 6 (B). Herein, as for piezoelectric material 1041, the direction of electric field coincides with direction of polarization, but as for piezoelectric material 1042, the direction of electric field counters with direction of polarization. Therefore, the following Expression can express the amount of strains S13 and S14 in the piezoelectric materials 1041 and 1042 of each layer in case of resonance by $\lambda/2$ resonance mode. S13=sin 0−sin (−$\pi/2$)=1 ... (20), S14=−(sin $\pi/2$−sin 0)=−1 ... (21). Since the piezoelectric materials 1041 and 1042 of each layer are therefore distorted in reverse phase, the amount of strains of the whole laminated piezoelectric material 1040 is S13+S14=0 ... (22), and resonance of the laminated piezoelectric material 1040 is balanced, and resonance of the laminated piezoelectric material 1040 disappears.

Moreover, the following Expression can express the amount of strains S15 and S16 in the piezoelectric materials 1041 and 1042 of each layer in case of resonance by $2\lambda/2$ resonance mode. S15=sin $\pi/2$−sin (−$\pi/2$)=2 ... (23), S16=−(sin $3\pi/2$−sin $\pi/2$)=2 ... (24). Therefore, since the piezoelectric materials 1041 and 1042 of each layer are distorted in phase, the whole amount of strains of the laminated piezoelectric material 1040 is S15+S16=4 ... (25), resonance of the laminated piezoelectric material 1040 is amplified by four times as amount of strains.

The amount of strains of the whole laminated piezoelectric material 1040 can be similarly calculated in case of $3\pi/2$ or more resonance modes.

With respect to the laminated piezoelectric material in which two piezoelectric materials are laminated and connected parallel electrically, the table in FIG. 7 can represent the relation between the direction of polarization of a laminated piezoelectric material and the direction of the electric field and the amount of strains of the whole laminated piezoelectric material as determined above. The result plotted for every pattern about the relation between a resonance order and the amount of strains of the whole laminated piezoelectric material is shown in FIG. 8.

Figure 8:
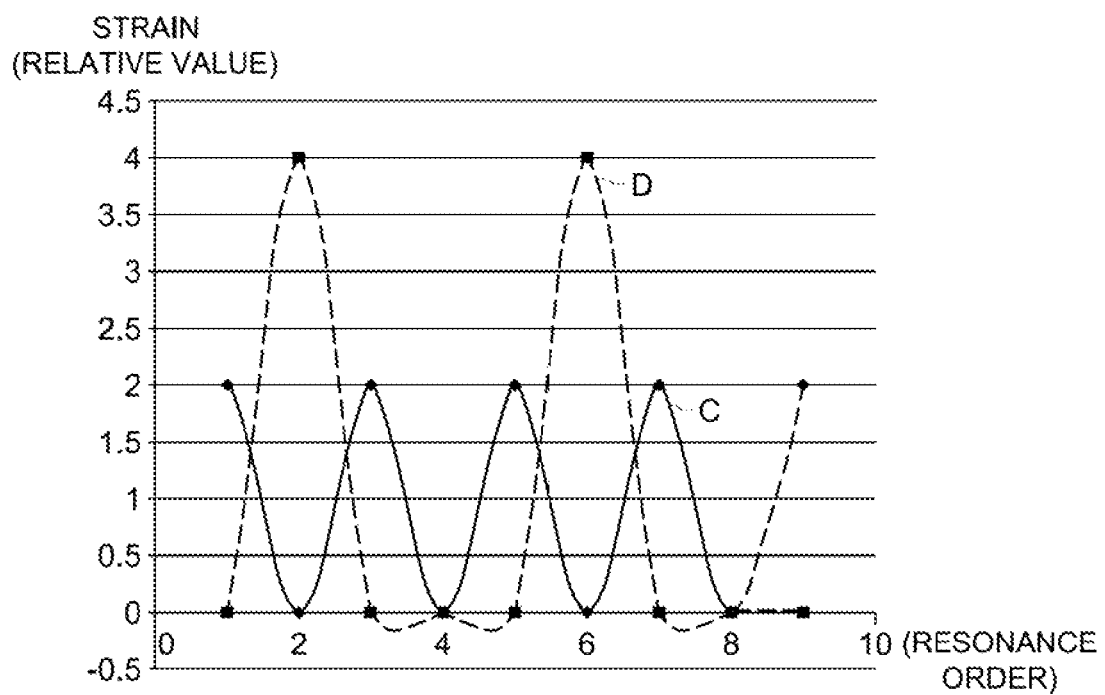
FIG. 8 is a graph showing the relation between a resonance order and the amount of strains of a laminated piezoelectric material.

As shown in FIGS. 7 and 8, in both of the cases of Pattern C and D, high sensitivity can be obtained in a high order frequency as well as the case of the laminated piezoelectric material connected in series. However, since the amount of strains of each piezoelectric material is balanced between peaks, whereby the resonance of the whole laminated piezoelectric material is no longer obtained, and there exists the frequency band which cannot be utilized.

Figure 10:
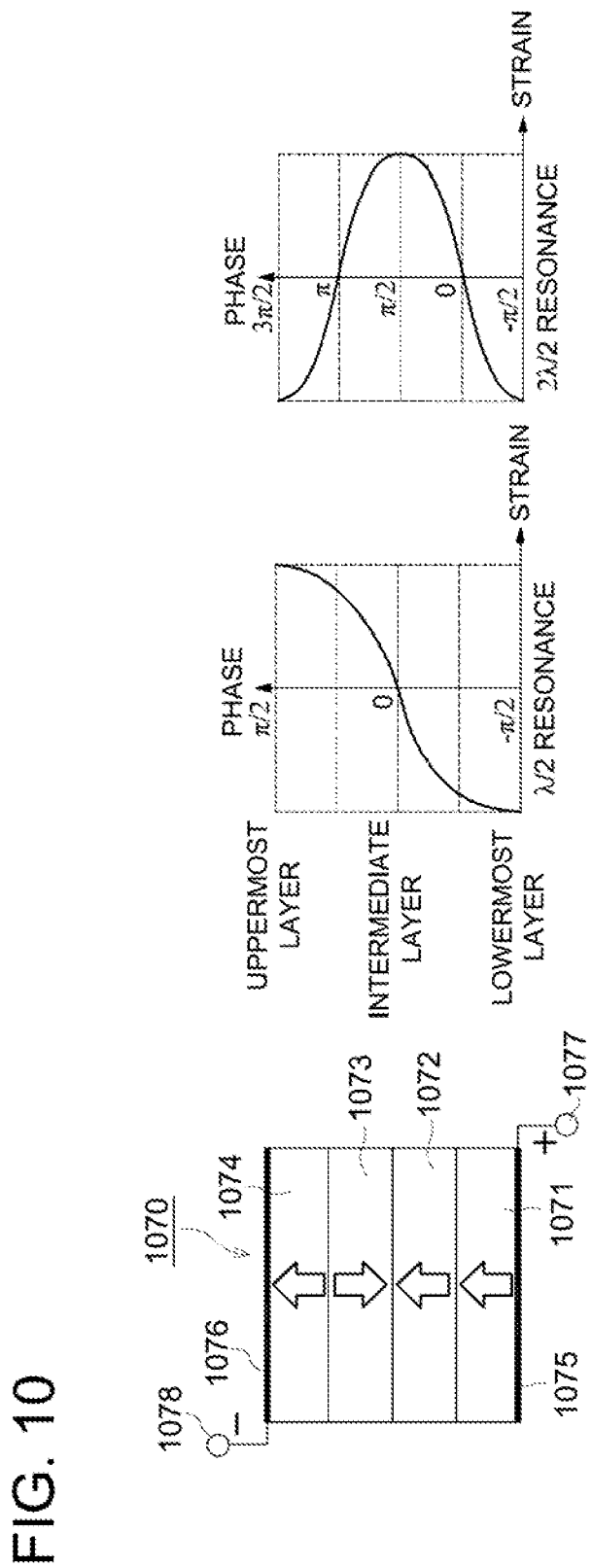
FIG. 10 is a figure explaining the relation between the directions of polarization and electric field in a four-layered laminated piezoelectric material and the amount of strains of a laminated piezoelectric material.

Next, with reference to FIGS. 9 and 10, explained is an example of a laminated piezoelectric material laminated by four piezoelectric materials in series connection. As shown in FIG. 9 (A), piezoelectric materials 1051 to 1054 in the laminated piezoelectric material 1050 having series connection of the four piezoelectric materials are subjected to have the same direction of polarizations. That is, as for any piezoelectric materials 1051 to 1054, the direction of polarization is subjected towards the upper layer from the lower layer. With respect to a laminated piezoelectric material 1050, voltage is applied through terminals 1057 and 1058 with the polarity of the voltage in the electrode layer 1055 being positive and in the electrode layer 1056 being negative. In the case of resonate by $\lambda/2$ resonance mode and $2\lambda/2$ resonance mode, transition of each amount of strains is shown in FIG. 9(A). The direction of electric field coincides with the direction of polarization in the piezoelectric materials 1051 to 1054 in any layers. Therefore, the following Expression can express the amount of strains S17 and S20 in the piezoelectric materials 1051 and 1054 of each layer in case of resonance by $\lambda/2$ resonance mode. Herein, the amount of strain each is represented by rounding off to the second decimal place. S17=sin $(-\pi/4)$-sin $(-\pi/2)$=0.3 . . . (26), S18=sin 0-sin $(-\pi/4)$= 0.7 . . . (27), S19=sin $\pi/4$-sin 0=0.7 . . . (28), S20=sin $\pi/2$-sin $\pi/4$=0.3 . . . (29). Since the piezoelectric materials 1051 to 1054 of each layer are therefore distorted in phase, the amount of strains of the whole laminated piezoelectric material 1000 is S17+S18+S19+S20=2 . . . (30), and the resonance of the laminated piezoelectric material 1050 is amplified by twice as amount of strains.

Moreover, the following Expressions can express the amount of strains S21 to S24 in the piezoelectric materials 1051 to 1054 of each layer in case of resonance by $2\lambda/2$ resonance mode. S21=sin 0-sin $(-\pi/2)$=1 . . . (31), S22=sin $\pi/2$-sin 0=1 . . . (32), S23=sin $\pi$-sin $\pi/2$=-1 . . . (33), S24=sin $3\pi/2$-sin $\pi$=-1 . . . (34). Therefore, since the combination of the piezoelectric materials 1051 and 1052 and the combination of the piezoelectric materials 1053 and 1054 are distorted in phase, however between combinations distortion occurs by reverse phase, the whole amount of strains of the laminated piezoelectric material 1050 is S21+S22+S23+S24=0 . . . (35), whereby the amount of strains of each layer is balanced, and resonance of the laminated piezoelectric material 1050 disappears.

The amount of strains of the laminated piezoelectric material 1050 whole can be similarly calculated in case of $3\pi/2$ or more resonance modes.

On the other hand, in the example shown in FIG. 9 (B), piezoelectric materials 1061 to 1064 in the laminated piezoelectric material 1060 are subjected to have alternately reverse direction of polarizations. That is, as for the piezoelectric materials 1061 and 1063, the direction of polarization is subjected towards the lower layer from the upper layer, and the piezoelectric materials 1062 and 1064, the direction of polarization is subjected towards the upper layer from the lower layer. With respect to a laminated piezoelectric material 1060, voltage is applied through terminals 1067 and 1068 with the polarity of the voltage in the electrode layer 1065 being positive and in the electrode layer 1066 being negative. In the case of resonate by $\lambda/2$ resonance mode and $2\lambda/2$ resonance mode, transition of each amount of strains is shown in FIG. 9 (B). Herein, as for piezoelectric materials 1061 and 1063, the direction of electric field coincides with direction of polarization, but as for piezoelectric materials 1062 and 1064, the direction of electric field counters with direction of polarization. Therefore, the following Expressions can express the amount of strains S25 to S28 in the piezoelectric materials 1061 to 1064 of each layer in case of resonance by $\lambda/2$ resonance mode. Herein, the amount of strain each is represented by rounding off to the second decimal place. S25=sin $(-\pi/4)$-sin $(-\pi/2)$=0.3 . . . (36), S26=-(sin 0-sin $(-\pi/4)$)=-0.7 . . . (37), S27=sin $\pi/4$-sin 0=0.7 . . . (38), S28=-(sin $\pi/2$-sin $\pi/4$)=-0.3 . . . (39). Therefore, since the combination of the piezoelectric materials 1061 and 10563 and the combination of the piezoelectric materials 1062 and 1064 are distorted in phase, however combinations are distorted by reverse phase, the whole amount of strains of the laminated piezoelectric material 1060 is S25+S26 S27+S28=0 . . . (40), the amount of strains of each layer is balanced, and resonance of the laminated piezoelectric material 1060 disappears.

Moreover, the following Expressions can express the amount of strains 29 to S32 in the piezoelectric materials 1061 to 1064 of each layer in case of resonance by $2\lambda/2$ resonance mode. S29=sin 0-sin $(-\pi/2)$=1 . . . (41), S30=-(sin $\pi/2$-sin 0)=-1 . . . (42), S31=sin $\pi$-sin $\pi/2$=-1 . . . (43), S32=-(sin $3\pi/2$-sin $\pi$)=1 . . . (44). Therefore, since the combination of the piezoelectric materials 1061 and 1063 and the combination of the piezoelectric materials 1062 and 1064 are distorted in phase, however combinations are distorted by reverse phase, the whole amount of strains of the laminated piezoelectric material 1060 is S29+S30+S31+S32=0 . . . (45), the amount of strains of each layer is balanced, and resonance of the laminated piezoelectric material 1060 disappears.

The amount of strains of the whole laminated piezoelectric material 1060 can be similarly calculated in case of $3\pi/2$ or more resonance modes.

Furthermore, in the example shown in FIG. 10, piezoelectric materials 1071 to 1074 in the laminated piezoelectric material 1070 are subjected to have reverse direction of polarizations. That is, as for the piezoelectric materials 1071, 1072, and 1074, the direction of polarization is subjected towards the lower layer from the upper layer, and the piezoelectric material 1073, the direction of polarization is subjected towards the upper layer from the lower layer. With respect to a laminated piezoelectric material 1070, voltage is applied through terminals 1077 and 1078 with the polarity of the voltage in the electrode layer 1075 being positive and in the electrode layer 1076 being negative. In the case of resonate by $\lambda/2$ resonance mode and $2\lambda/2$ resonance mode, transition of each amount of strains is shown in FIG. 10. Herein, as for piezoelectric materials 1071, 1072 and 1074, the direction of electric field coincides with direction of polarization, but as for piezoelectric material 1073, the direction of electric field counters with direction of polarization. Therefore, the following Expressions can express the amount of strains S33 to S36 in the piezoelectric materials 1071 to 1074 of each layer in case of resonance by $\lambda/2$ resonance mode. Herein, the amounts of strain are represented by rounding off to the second decimal place. S33=sin $(-\pi/4)$-sin $(-\pi/2)$=0.3 . . . (46), S34=sin 0-sin $(-\pi/4)$=0.7 . . . (48), S35=-(sin $\pi/4$-sin 0)=-0.7 . . . (48), S36=sin $\pi/2$-sin $\pi/4$=0.3 . . . (49). Therefore, since the piezoelectric materials 1071, 1072 and 1073 are distorted in phase, however the piezoelectric materials 1073 is distorted by reverse phase to the piezoelectric materials 1071, 1072 and 1074, the whole amount of strains of the laminated piezoelectric material 1070 is S33+S34+S35+S36=0.6 . . . (50), the resonance of the laminated piezoelectric material 1070 is amplified by 0.6 times as amount of strains.

Moreover, the following Expressions can express the amount of strains 37 to S40 in the piezoelectric materials 1071 to 1074 of each layer in case of resonance by 2λ/2 resonance mode. S37=sin 0−sin (−π/2)=1 . . . (51), S38=sin π/2−sin 0=1 . . . (52), S39=−(sin π−sin π/2)=1 . . . (53), S40=sin 3π/2−sin π=−1 . . . (54). Therefore, since the piezoelectric materials 1071, 1072 and 1073 are distorted in phase, however the piezoelectric materials 1074 is distorted by reverse phase to the piezoelectric materials 1071, 1072 and 1073, the whole amount of strains of the laminated piezoelectric material 1070 is S37+S38+S39+S40=2 . . . (55), the resonance of the laminated piezoelectric material 1070 is amplified by twice as amount of strains.

The amount of strains of the whole laminated piezoelectric material 1070 can be similarly calculated in case of 3π/2 or more resonance modes.

With respect to the laminated piezoelectric material in which four piezoelectric materials are laminated and connected series electrically, the table in FIG. 11 can represent the relation between the direction of polarization of a laminated piezoelectric material and the direction of the electric field and the amount of strains of the whole laminated piezoelectric material as determined above. The result plotted for every pattern about the relation between a resonance order and the amounts of strains of the whole laminated piezoelectric material are shown in FIGS. 12 and 13.

Figure 12:
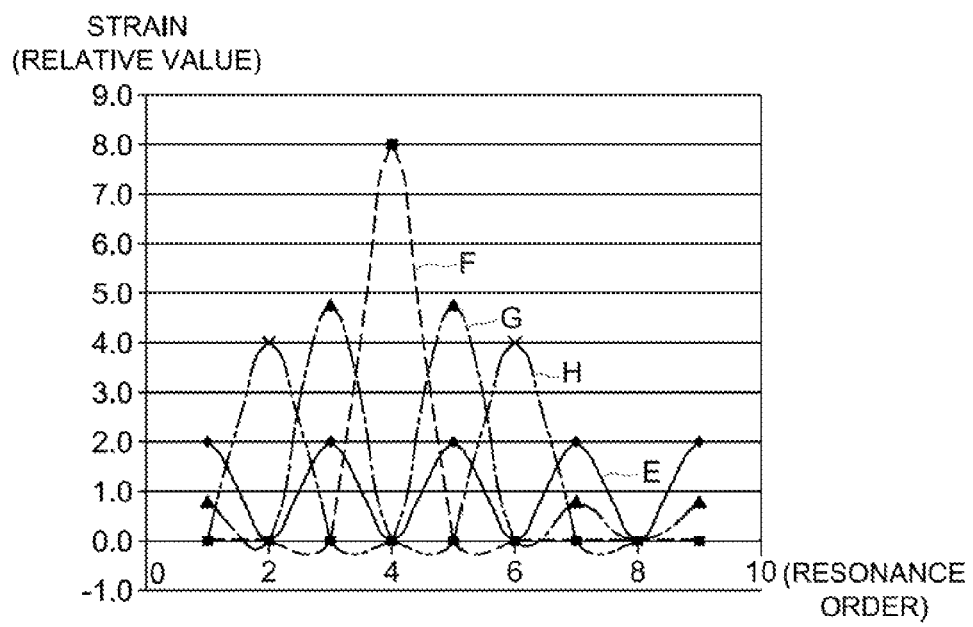
FIG. 12 is a graph showing the relation between a resonance order and the amount of strains of a laminated piezoelectric material.
Figure 13:
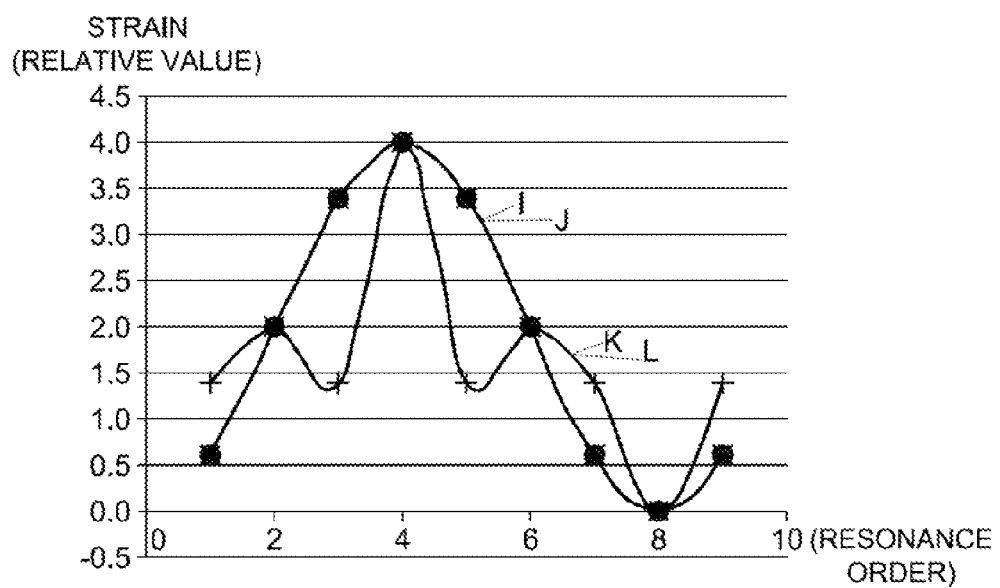
FIG. 13 is a graph showing the relation between a resonance order and the amount of strains of a laminated piezoelectric material.

As shown in FIGS. 11-13, in the case of Pattern E where the direction of the polarization coincides with or counters the direction of the electric field each in all of the piezoelectric materials, the resonance as twice as the amount of strains of the laminated piezoelectric material is seen at the odd resonance order, while at the even resonance order, no resonance can be seen in the laminated piezoelectric material. In the case of Pattern F, the piezoelectric material having the direction of the polarization coincides with the direction of the electric field is alternately laminated with the piezoelectric material having the direction of the polarization counters to the direction of the electric field. The resonance of 8 times as the amount of strains of the laminated piezoelectric material is seen at a resonance frequency with four times of the basic resonance frequency (fourth resonance order), while at the other resonance order, no resonance can be seen in the laminated piezoelectric material. In the case of Pattern G where the direction of the polarization coincides with the direction of the electric field in the uppermost layer and the lowermost layer and counters in intermediate layer of the piezoelectric material; or where the direction of the polarization counters to the direction of the electric field in the uppermost layer and the lowermost layer and coincides with in intermediate layer of the piezoelectric material, the resonance occurs when a frequency is at the odd order of basic resonance frequency. In the case of Pattern G, the resonance of 4.8 times as the amount of strains of the laminated piezoelectric material is seen at a resonance frequency with 3 times (third resonance order) and 5 times (fifth resonance order) of the basic resonance frequency, however, no resonance can be noticed when a frequency is at the even order of basic resonance frequency. In the case of Pattern H where the direction of the polarization coincides with the direction of the electric field in the lowermost layer and the adjacent layer thereto and counters to in the uppermost layer and the adjacent layer thereto; or where the direction of the polarization counters to the direction of the electric field in the lowermost layer and the adjacent layer thereto and coincides with in the uppermost layer and the adjacent layer thereto, the resonance of 4 times as the amount of strains of the laminated piezoelectric material is seen at a resonance frequency with 2 times (secondary resonance order) and 6 times (sixth resonance order) of the basic resonance frequency, however, no resonance can be noticed when a frequency is at the other order of basic resonance frequency. Further, in the case of Patterns I to L where the direction of the polarization coincides with the direction of the electric field in only one layer or where the direction of the polarization counters to the direction of the electric field in only one layer, the resonance of the laminated piezoelectric material can be seen in any resonance order from the first to seventh resonance order, while the peak appears at a resonance frequency with 4 times (fourth resonance order).

As described above, in any of Pattern E, Pattern G, and Pattern H, high sensitivity can be obtained in a high order frequency. However, since the amount of strains of each piezoelectric material is balanced between peaks, whereby the resonance of the whole laminated piezoelectric material is no longer obtained, and there exists the frequency band which cannot be utilized. Further, in Pattern F, extremely high sensitivity can be obtained at the specific high order frequency. However, applicable frequency band is restricted to the specific frequency and the vicinity thereof, whereby the applicable frequency band becomes extremely narrow.

On the other hand, in any of Pattern I to Pattern L, since the laminated piezoelectric material resonates by amplified amount of strain in a high order frequency, relatively high sensitivity can be obtained. Moreover, in any of Pattern I to Pattern L, since resonance of a laminated piezoelectric material can be obtained in any frequency of from the first order to the seventh order, wide frequency band can be utilized.

Figure 14A:
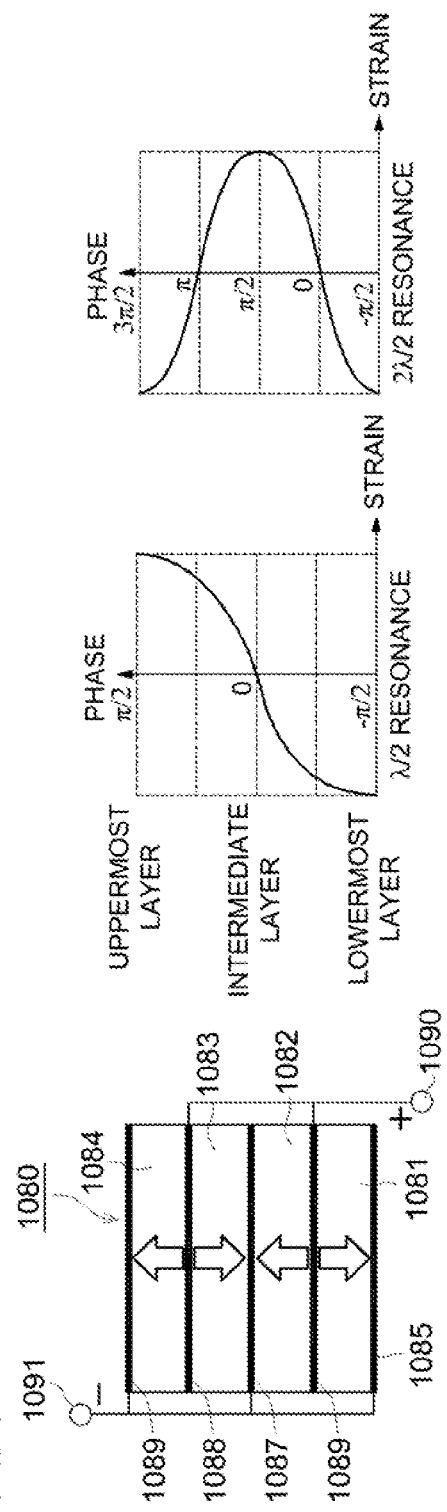
FIGS. 14A and 14B each is a figure explaining the relation between the directions of polarization and electric field in a four-layer laminated piezoelectric material and the amount of strains of a laminated piezoelectric material.
Figure 14B:
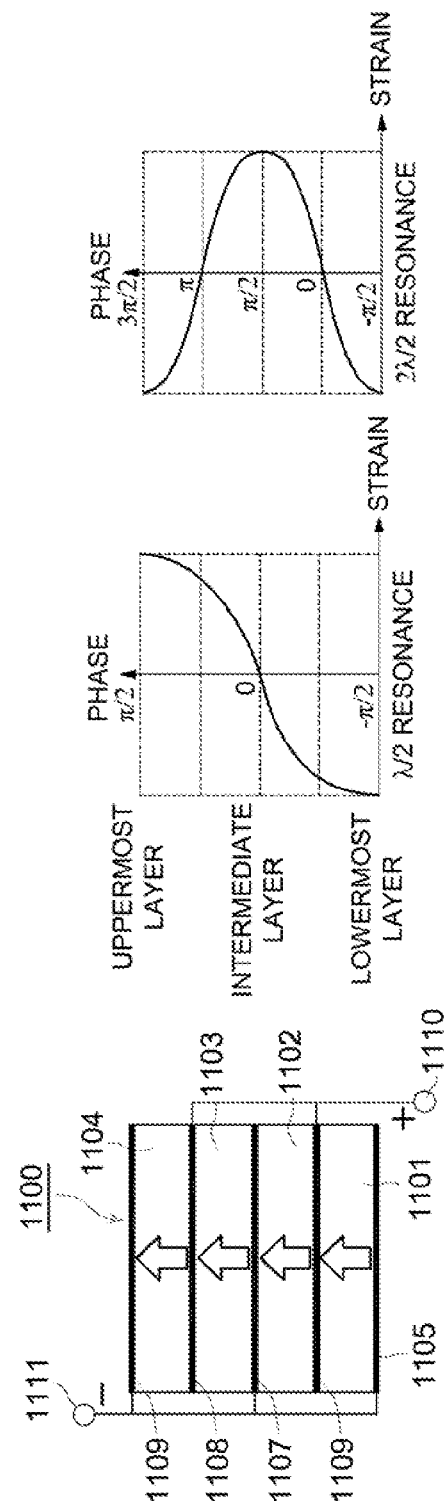
Figure 15:
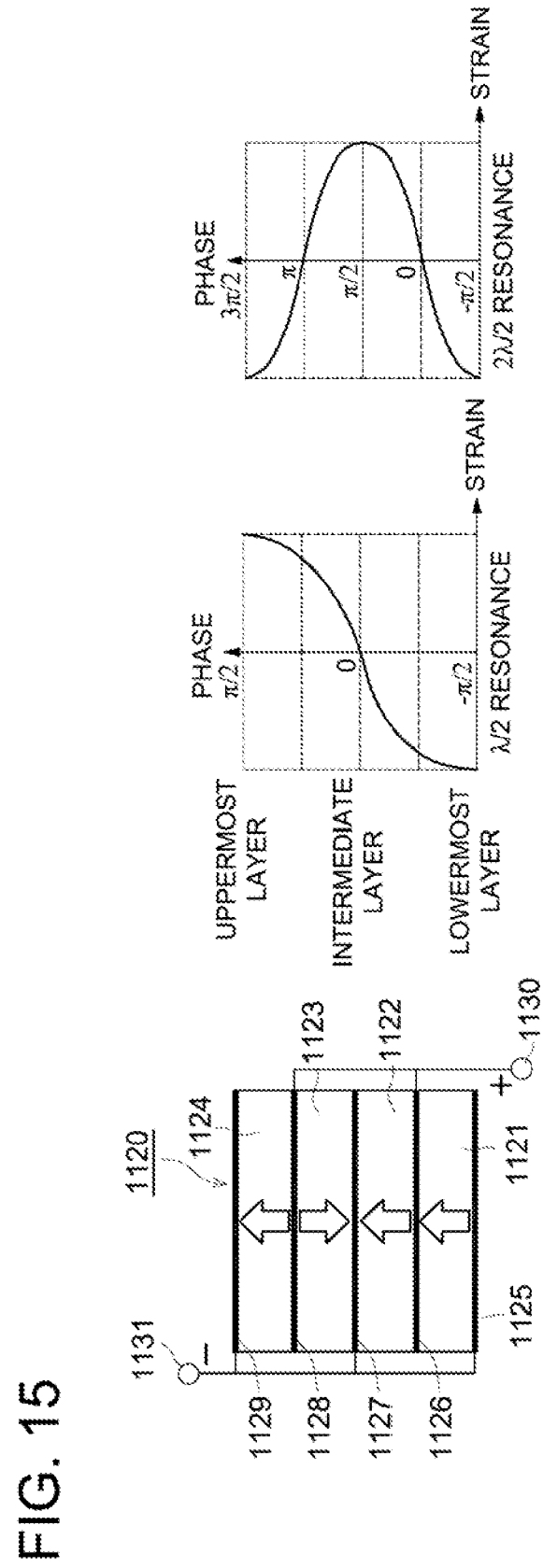
FIG. 15 is a figure explaining the relation between the directions of polarization and electric field in a four-layered laminated piezoelectric material and the amount of strains of a laminated piezoelectric material.

Next, with reference to FIGS. 14 and 15, explained is an example of a laminated piezoelectric material laminated by four piezoelectric materials in parallel connection. As shown in FIG. 14 (A), piezoelectric materials 1081 to 1084 in the laminated piezoelectric material 1080 are subjected to have alternately reverse direction of polarizations. That is, as for any piezoelectric materials 1081 and 1083, the direction of polarization is subjected towards the upper layer from the lower layer and as for any piezoelectric materials 1082 and 1084, the direction of polarization is subjected towards the lower layer from the upper layer. With respect to a laminated piezoelectric material 1080, voltage is applied through terminals 1090 and 1091 with the polarity of the voltage in the electrode layers 1086 and 1088 being positive and in the electrode layers 1085, 1087 and 1089 being negative. In the case of resonate by λ/2 resonance mode and 2λ/2 resonance mode, transition of each amount of strains is shown in FIG. 14(A). The direction of electric field coincides with the direction of polarization in the piezoelectric materials 1081 to 1084 in any layers. Therefore, the following Expression can express the amount of strains S41 to S44 in the piezoelectric materials 1081 to 1084 of each layer in case of resonance by λ/2 resonance mode. Herein, the amount of strain each is represented by rounding off to the second decimal place. S41=sin (−π/4)−sin (−π/2)=0.3 . . . (56), S42=sin 0−sin (−π/4)=0.7 . . . (57), S43=sin π/4−sin 0=0.7 . . . (58), S44=sin π/2−sin π/4=0.3 . . . (59). Since the piezoelectric materials 1081 to 1084 of each layer are therefore distorted in phase, the amount of strains of the whole laminated piezoelectric material 1080 is S41+S42+S43+S44=2 . . . (60), and the resonance of the laminated piezoelectric material 1080 is amplified by twice as amount of strains.

Moreover, the following Expressions can express the amount of strains S45 to S48 in the piezoelectric materials 1081 to 1084 of each layer in case of resonance by 2λ/2 resonance mode. S45=sin 0−sin (−π/2)=1 . . . (61), S46=sin π/2−sin 0=1 . . . (62), S47=sin π−sin π/2=−1 . . . (63), S48=sin 3π/2−sin π=−1 . . . (64). Therefore, since the combination of the piezoelectric materials 1081 and 1082 and the combination of the piezoelectric materials 1083 and 1084 are distorted in phase, however between the combinations distortion occurs by reverse phase, the whole amount of strains of the laminated piezoelectric material 1058 is S45+S46+S47+S48=0 . . . (65), the amount of strains of each layer is balanced, and resonance of the laminated piezoelectric material 1080 disappears.

The amount of strains of the laminated piezoelectric material 1080 whole can be similarly calculated in case of 3π/2 or more resonance modes.

On the other hand, in the example shown in FIG. 14 (B), all piezoelectric materials 1101 to 1104 in the laminated piezoelectric material 1100 are subjected to have reverse direction of polarizations. That is, as for the piezoelectric materials 1101 to 1104 each, the direction of polarization is subjected towards the lower layer from the upper layer. With respect to a laminated piezoelectric material 1100, voltage is applied through terminals 1110 and 1111 with the polarity of the voltage in the electrode layers 1106 and 1108 being positive and in the electrode layers 1105, 1107, and 1109 being negative. In the case of resonate by λ/2 resonance mode and 2λ/2 resonance mode, transition of each amount of strains is shown in FIG. 14 (B). Herein, as for piezoelectric materials 1102 and 1104, the direction of electric field coincides with direction of polarization, but as for piezoelectric materials 1101 and 1103, the direction of electric field counters with direction of polarization. Therefore, the following Expressions can express the amount of strains S49 to S52 in the piezoelectric materials 1101 to 1104 of each layer in case of resonance by λ/2 resonance mode. Herein, the amount of strain each is represented by rounding off to the second decimal place. S49=−(sin (−π/4)−sin (π/2))=−0.3 . . . (66), S50=sin 0−sin (−π/4)=0.7 . . . (67), S51=−(sin π/4−sin 0)=−0.7 . . . (68), S52=sin π/2−sin π/4=0.3 . . . (69). Therefore, since the combination of the piezoelectric materials 1101 and 1103 and the combination of the piezoelectric materials 1102 and 1104 are distorted in phase, however between the combinations distortion occurs by reverse phase, the whole amount of strains of the laminated piezoelectric material 1100 is S49+S50+S51+S52=0 . . . (70), the amount of strains of each layer is balanced, and resonance of the laminated piezoelectric material 1070 disappears.

Moreover, the following Expressions can express the amount of strains S53 to S56 in the piezoelectric materials 1101 to 1104 of each layer in case of resonance by 2λ/2 resonance mode. S53=−(sin 0−sin (−π/2))=−1 . . . (71), S54=sin π/2−sin 0=1 . . . (72), S55=−(sin π−sin π/2)=1 . . . (73), S56=sin 3π/2−sin π−1 . . . (74). Therefore, since the combination of the piezoelectric materials 1101 and 1104 and the combination of the piezoelectric materials 1102 and 1103 are distorted in phase, however between the combinations distortion occurs by reverse phase, the whole amount of strains of the laminated piezoelectric material 1100 is S53+S54+S55+S56=0 . . . (75), the amount of strains of each layer is balanced, and resonance of the laminated piezoelectric material 1100 disappears.

The amount of strains of the whole laminated piezoelectric material 1100 can be similarly calculated in case of 3π/2 or more resonance modes.

Furthermore, in the example shown in FIG. 15, any one of the piezoelectric materials 1121 to 1124 in the laminated piezoelectric material 1120 is subjected to have reverse direction of polarizations to others. That is, as for the piezoelectric materials 1121, 1122, and 1124, the direction of polarization is subjected towards the lower layer from the upper layer, and the piezoelectric material 1123, the direction of polarization is subjected towards the upper layer from the lower layer. With respect to a laminated piezoelectric material 1120, voltage is applied through terminals 1130 and 1131 with the polarity of the voltage in the electrode layer 1120 being positive and in the electrode layers 1125, 1127 and 1129 being negative. In the case of resonate by λ/2 resonance mode and 2π/2 resonance mode, transition of each amount of strains is shown in FIG. 15. Herein, as for piezoelectric materials 1122, 1123 and 1124, the direction of electric field coincides with direction of polarization, but as for piezoelectric material 1121, the direction of electric field countess with direction of polarization. Therefore, the following Expressions can express the amount of strains S57 to S60 in the piezoelectric materials 1121 to 1124 of each layer in case of resonance by λ/2 resonance mode. Herein, the amounts of strain are represented by rounding off to the second decimal place. S57=−(sin (−π/4)−sin (−π/2))=−0.3 . . . (76), S58=sin 0−sin (−π/4)=0.7 . . . (77), S59=sin π/4−sin 0=0.7 . . . (78), S60=sin π/2−sin π/4=0.3 . . . (79). Therefore, since the piezoelectric materials 1122, 1123 and 1124 are distorted in phase, however the piezoelectric materials 1121 is distorted by reverse phase to the piezoelectric materials 1122, 1123 and 1124, the whole amount of strains of the laminated piezoelectric material 1120 is S57+S58+S59+S60=1.4 . . . (80), the resonance of the laminated piezoelectric material 1120 is amplified by 1.4 times as amount of strains.

Moreover, the following Expressions can express the amount of strains S61 to S64 in the piezoelectric materials 1121 to 1124 of each layer in case of resonance by 2λ/2 resonance mode. S61=−(sin 0−sin (−π/2))=−1 . . . (81), S62=sin π/2−sin 0=1 . . . (82), S63=sin π−sin π/2=−1 . . . (83), S64=sin 3π/2−sin π=−1 . . . (84). Therefore, since the piezoelectric materials 1121, 1123 and 1124 are distorted in phase, however the piezoelectric materials 1122 is distorted by reverse phase to the piezoelectric materials 1121, 1123 and 1124, the whole amount of strains of the laminated piezoelectric material 1120 is S61+S62+S63+S64=2 . . . (85), the resonance of the laminated piezoelectric material 1120 is amplified by twice as amount of strains.

The amount of strains of the whole laminated piezoelectric material 1120 can be similarly calculated in case of 3π/2 or more resonance modes.

With respect to the laminated piezoelectric material in which four piezoelectric materials are laminated and connected in parallel electrically, the table in FIG. 16 can represent the relation between the direction of polarization of a laminated piezoelectric material and the direction of the electric field and the amount of strains of the whole laminated piezoelectric material as determined above. The result plotted for every pattern about the relation between a resonance order and the amounts of strains of the whole laminated piezoelectric material are shown in FIGS. 17 and 18.

Figure 17:
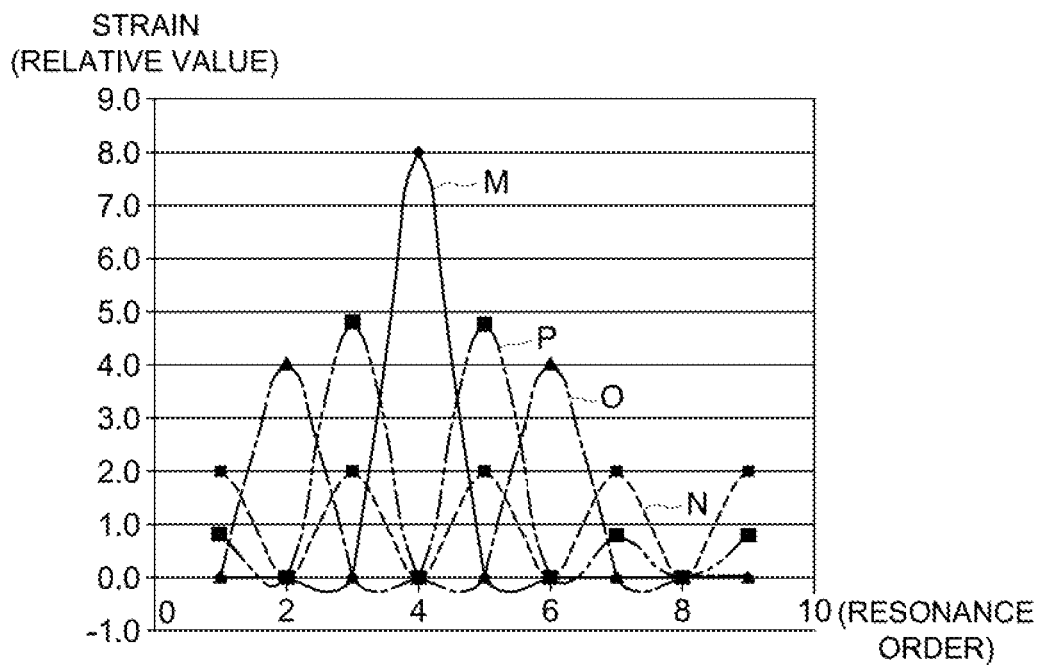
FIG. 17 is a graph showing the relation between a resonance order and the amount of strains of a laminated piezoelectric material.
Figure 18:
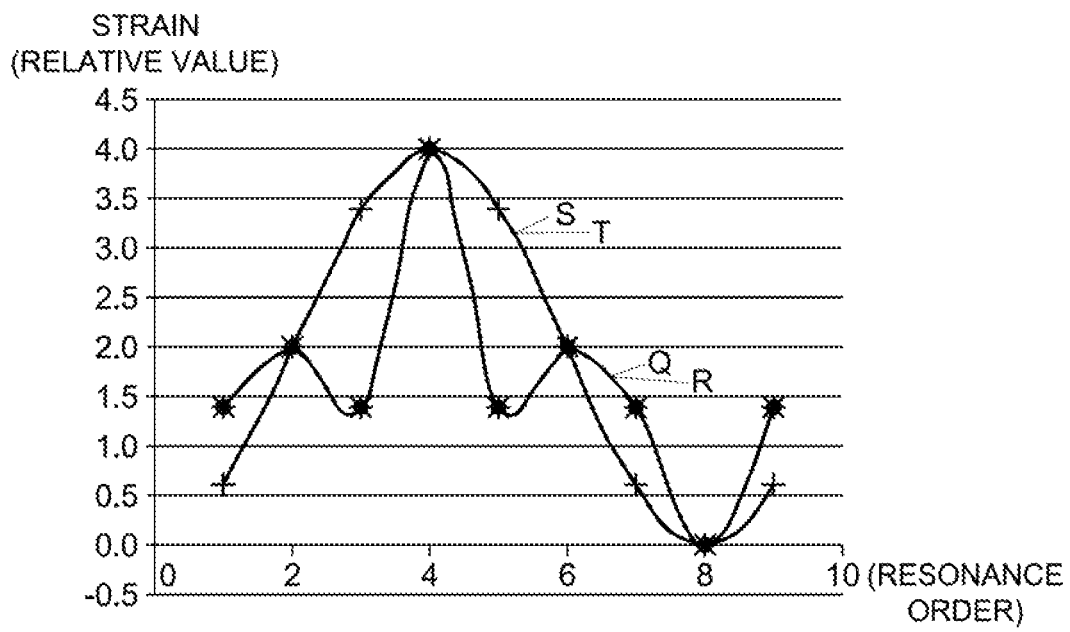
FIG. 18 is a graph showing the relation between a resonance order and the amount of strains of a laminated piezoelectric material.

As shown in FIGS. 16-18, also in the laminated piezoelectric material connected in parallel, obtained is the same result as the laminated piezoelectric material connected in series. That is, whether the piezoelectric material of each layer is connected in series or in parallel, the amount of strain of the whole laminated piezoelectric material when being excited is determined by the relation between the direction of polarization and the direction of electric field for every piezoelectric material of each layer.

As described above, although each of laminated piezoelectric materials by the four piezoelectric materials connected in series can have the same effect as the laminated piezoelectric materials connected in parallel, the laminated piezoelectric material by the four piezoelectric materials connected in parallel is advantageous in respect of the followings. That is, when a plurality of piezoelectric materials are laminated connected in series, since a capacity of capacitor is in inverse proportion to the thickness of the whole laminated piezoelectric material, an electric impedance increases proportionally to the thickness of the whole laminated piezoelectric material. Therefore, it is necessary to take into consideration of the impedance matching with the system which controls excitation of a laminated piezoelectric material. On the other hand, when a plurality of piezoelectric materials is laminated in parallel connection, since a capacity of capacitor becomes large by laminating the piezoelectric material, electric impedance can be decreased. Therefore, the problem of impedance matching with the system is reduced. Furthermore, since it is not necessary to have large element pitch in order to lower impedance in the case of providing element by a laminated piezoelectric material, whereby a lateral resolution does not decrease, for example when it is applied to an ultrasound diagnostic apparatus.

From the above result, as a desirable laminated piezoelectric material applied to the present embodiment, the piezoelectric materials are laminated so that a direction of an electric field generated by applied voltage and a direction of the remanent polarization counters in only one of the piezoelectric material of four layer-piezoelectric materials and coincides with other three layers in the one unit, or the direction of the electric field and the direction of the remanent polarization coincides with only one of the piezoelectric material of four layer-piezoelectric materials and counters in other three layers in the one unit for example, such as Pattern I to Pattern L shown in FIG. 11 and Pattern Q to Pattern T shown in FIG. 16. According to having such constitution, a laminated piezoelectric material having high sensitivity in a high frequency domain can be obtained. Further, since the strains of each piezoelectric material are not balanced between peaks, whereby there exists the wide frequency band which can be utilized the resonance of the laminated piezoelectric material, and it becomes practical.

Herein, the laminated piezoelectric material formed by laminating four piezoelectric materials is referred as example in the explanation described above, however, the same effect can be obtained even if the number of laminations of the piezoelectric material may be an integral multiple of 4. In this case, the relation between the directions of polarization and the electric field may be taken into consideration for every unit, provided that the four piezoelectric materials may be one unit.

Next, an ultrasound probe will be explained which applies the laminated piezoelectric material described above. The ultrasound probe applied in the present embodiment is a main component part of a medical ultrasound diagnostic apparatus, and functions to transmit an ultrasound wave by an electric signal, and to outputs an electric signal by receiving an ultrasound wave. Although the linear electronic scan probe is adopted as an ultrasound probe in the following explanation, any of an electronic scanning system or a machine scan system may be adopted. Further, any one of a linear scan system, a sector scanning system or a convex scan system may also be adopted.

Figure 19:
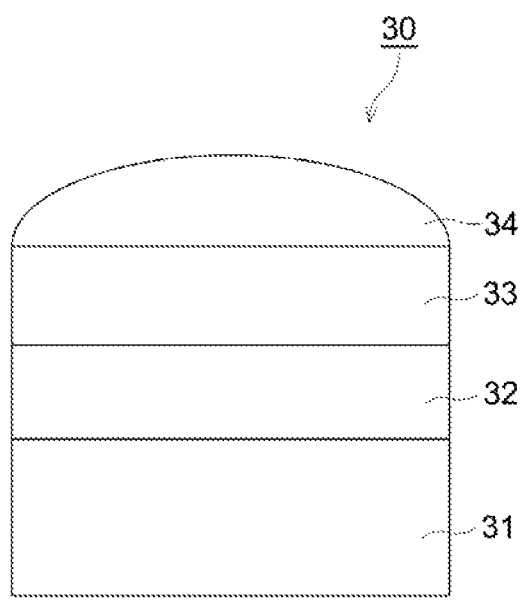
FIG. 19 is a sectional view showing the schematic constitution of the ultrasound probe according to the present embodiment.

As shown in FIG. 19, the ultrasound probe 30 comprises a backing layer 31, a piezoelectric layer 32 laminated on the backing layer 31, an acoustic matching layer 33 laminated on the piezoelectric layer, and an acoustic lens 34 laminated on the acoustic matching layer 33 from the bottom of the front view.

The backing layer 31 is an ultrasound absorber which supports a piezoelectric layer 32 and absorbs an unnecessary ultrasound. That is, the backing layer 31 is equipped on a plate at opposite direction to transmit and receive a sound in the test object by the piezoelectric layer 32, and absorbs the ultrasound generated from the opposite direction of a test object.

As backing material for the backing layer 31, employable are thermoplastic resin such as vinyl chloride, polyvinyl butyral (PVB), ABS resin, polyurethane (PUR), polyvinyl alcohol (PVAL), polyethylene (PE), polypropylene (PP), polyacetal (POM), polyethylene terephthalate (PETP), fluorine resin (PTFE), polyethylene glycol, and polyethylene terephthalate-polyethylene glycol copolymer; press-molded composite materials in which powder such as titan oxide or ferrite is filled into natural rubber, ferrite rubber, or epoxy resin; and materials in which composite material is pulverized and mixed with above described thermoplastic resin or epoxy resin and hardened. In order to adjust acoustic impedance, inorganic material such as MACOR glass or porous material having void, can also be employable. Rubber based composite material and/or epoxy based composite material is used for preferable backing material. Shape thereof may be selected appropriately according to a shape of a piezoelectric layer 32 or a probe head having thereof.

The piezoelectric layer 32 is constituted by a plurality of elements which are made by dicing the laminated piezoelectric material mentioned above to predetermined pitch. These elements are arranged in the shape of a one-dimensional array in the azimuthal direction. Although the number of an element is arbitrary, in the present embodiment, they may be 192 pieces, for example. In addition, the piezoelectric layer 32 also may be dicing the laminated piezoelectric material so that an element may be arranged in the shape of a two-dimensional array.

An acoustic matching layer 33 functions to match acoustic impedances between a piezoelectric layer 32 and a test object, and to control reflection at interface. The acoustic matching layer 33 is provided on a test object side of piezoelectric layer 32, where corresponds to a direction of transmission and reception of ultrasound wave. The acoustic matching layer 33 has an intermediate acoustic impedance of the piezoelectric layer 32 and the test object.

As materials for acoustic matching layer, employable are aluminum, aluminum alloy (for example, Al—Mg alloy), magnesium alloy, MACOR glass, glass, fused quartz, copper graphite, PE (polyethylene), PP (polypropylene), PC (polycarbonate), ABC resin, ABS resin, AAS resin, AES resin, nylon (PA6, PA6-6), PPO (polyphenylene oxide), PPS (polyphenylene sulfide: also applicable with glass fiber), PPE (polyphenylene ether), PEEK (polyether ether keton), PAI (polyamide imide), PETP (polyethylene terephthalate), epoxy resin and urethane resin. It is preferable to employ a molded material comprising a thermosetting resin such as epoxy resin by adding filler such as zinc flower, titan oxide, silica, alumina, colcothar, ferrite, tungsten oxide, ytterbium oxide, barium sulfate, tungsten, and molybdenum.

Acoustic matching layer 33 may be constituted in a single layer or a plurality of layers, preferable in 2 or more layers, more preferable in 4 or more layers. Thickness of acoustic matching layer has to be determined to satisfy to be λ/4, provided that a wave length of ultrasound is λ. In the case of not satisfying it, a plurality of unnecessary spurious appears at a frequency point other than an original resonance frequency and causes a large deviation from fundamental acoustic properties. As the result, reverberation time increases and waveform distortion of reflection echo causes decrease of sensitivity or S/N, resulting in being undesirable. Thus, total thickness of acoustic matching layer is about in a range of 20-500 μm.

Acoustic lens 34 is arranged to focus the ultrasound beam in terms of reflection, resulting in enhance resolution. Namely, the acoustic lens 34 is provided on the side where the ultrasound probe 30 touches to the test object, whereby the ultrasound generated by the piezoelectric layer 32 can enter efficiently in the test object. The acoustic lens 34 has a lens form at the portion which touches the test object, for example, a convex type, a concave type, a surface-of-a-sphere type, or aspheric surface type, and focuses the ultrasound wave which enters into the test object in the thickness direction perpendicular to an imaging section.

Acoustic lens 34 comprises a soft polymer material which generally has intermediate acoustic impedance between the test object and acoustic matching layer 33.

As materials constituting the acoustic lens 34, employable is conventional homopolymer such as silicone based rubber, butadiene based rubber, polyurethane rubber, fluorine silicone rubber, or epichlorohydrin rubber; copolymer rubber such as ethylene-propylene copolymer rubber which is prepared by copolymerizing ethylene and propylene, or polyolefin such as polymethyl pentene or polystyrene. Of these, silicone based rubber and butadiene based rubber are preferably employed.

Next, an ultrasound diagnostic apparatus will be described which is equipped with ultrasound probe 30 as mentioned above.

Figure 20:
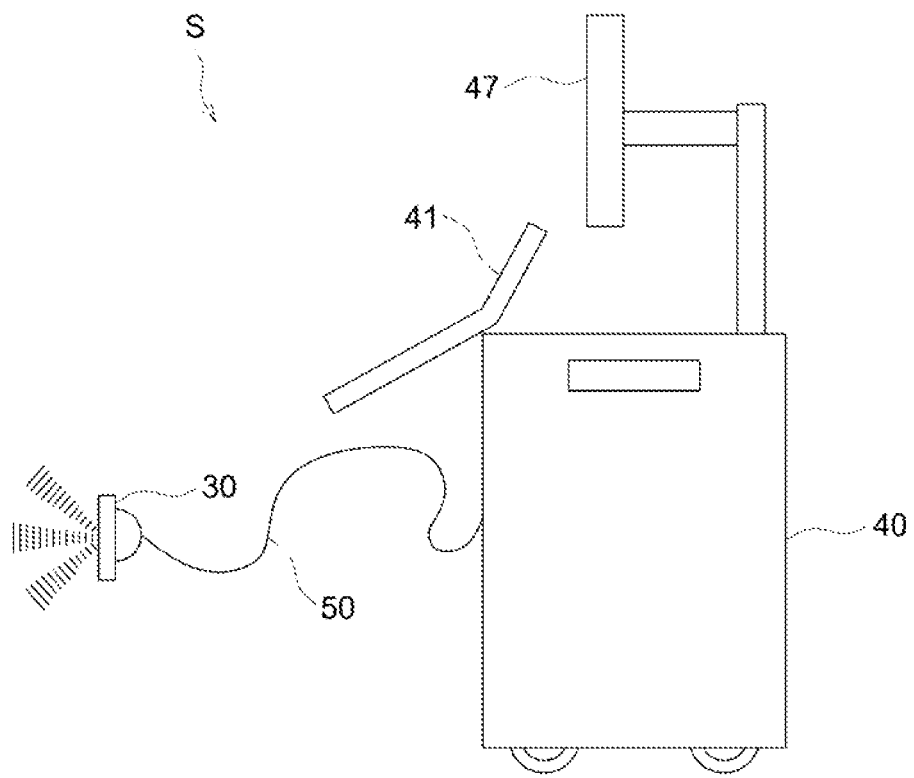
FIG. 20 is a figure showing the appearance constitution of the ultrasound diagnostic apparatus according to the present embodiment.
Figure 21:
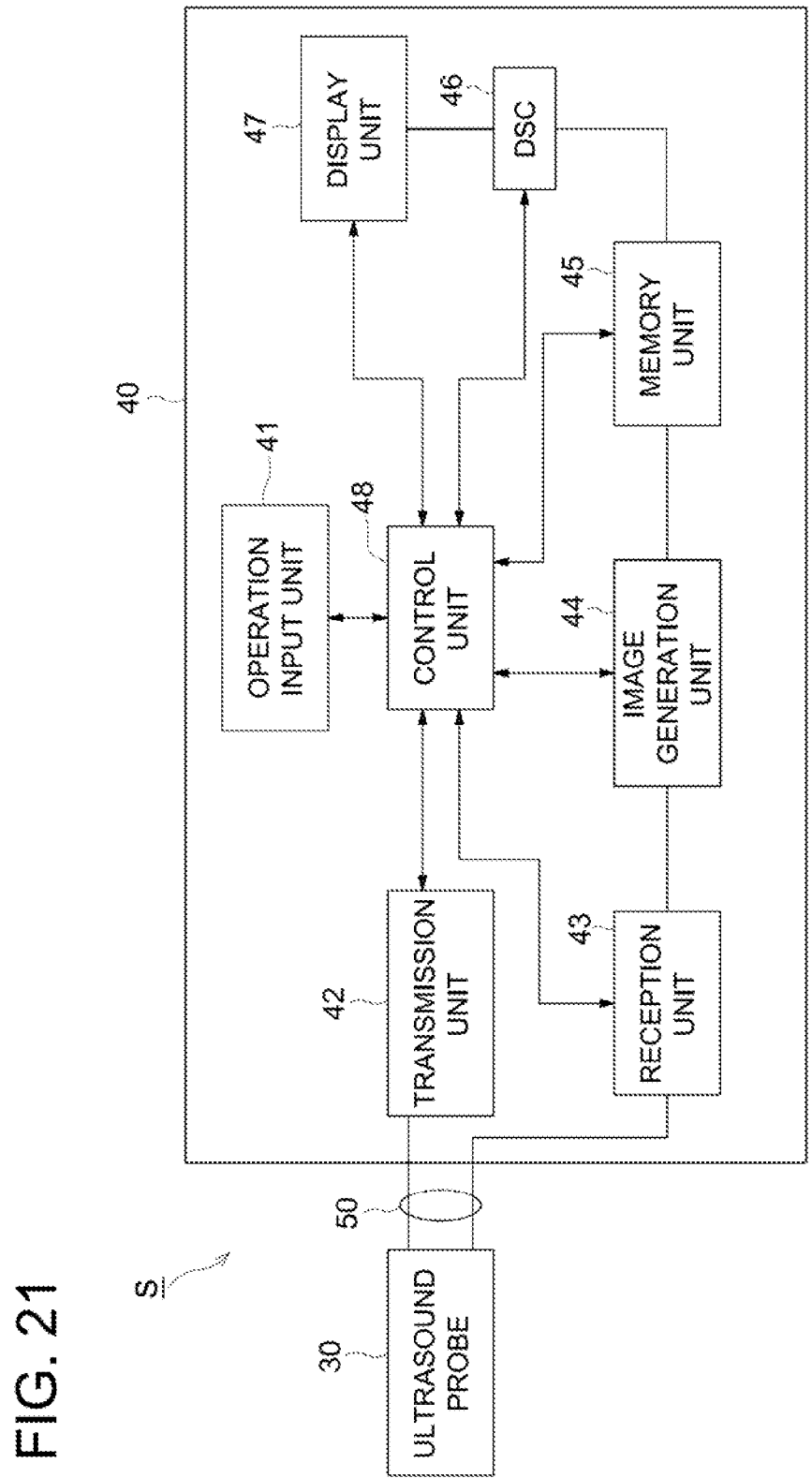
FIG. 21 is a block diagram showing the schematic constitution of the main part of ultrasound diagnostic apparatus.

As shown in FIGS. 20 and 21, the ultrasounds diagnostic apparatus S according to the present embodiment comprises the ultrasound probe 30 mentioned above and an ultrasound diagnostic apparatus main body 40 which is connected to the ultrasound probe 30 through a cable 50. The ultrasound diagnostic apparatus main body 40 functions to transmit a transmission ultrasound to a test object by transmitting an electric signal for driving the ultrasound probe 30. The ultrasound diagnostic apparatus main body 40 also functions to make imaging an internal state of the test object as an ultrasound image based on the received signal as a generated electric signal according to the reflective ultrasound wave received by the ultrasound probe 30.

As shown in FIG. 21, the ultrasound diagnostic apparatus main body 40 comprises, for example, Operation input unit 41, Transmission unit 42, Reception unit 43, Image generation unit 44, Memory unit 45, DSC (Digital Scan Converter) 46, Display unit 47 and Control unit 48.

Operation input unit 41 comprises various switches, buttons, track ball, mouse, and key board, for example, which are used to input a command to start diagnosis or data such as personal information on the test object, whereby outputs a control signal to Control unit 48.

Transmission unit 42 is a circuit which makes the ultrasound probe 30 generate a transmitted ultrasound wave according to control of the Control unit 48 by supplying the drive electric signal of predetermined voltage to the ultrasound probe 30 through a cable 50. Moreover, Transmission unit 42 is equipped with a clock generating circuit, a delay circuit, and a pulse generating circuit, for example. A clock generation circuit is a circuit which generates the clock signal which determines the transmitting timing and the transmitted frequency of a drive signal. A delay circuit is a circuit to focus a transmission beam comprising of transmission ultrasound, in which delay time of transmitting timing of the drive signal each is set up for every individual course for every channel and transmitting timing of the drive signal is delayed according to the predetermined delay time for transmitting the drive signal. Herein, the channel corresponds to one element of the laminated piezoelectric material elements. A pulse generation circuit is a circuit for generating the pulse signal as a drive signal with a predetermined cycle.

Reception unit 43 is a circuit which receives the received signal as an electric signal from an ultrasound probe 30 through a cable 50 under a control of Control unit 48. The reception unit 43 is equipped with an amplifier, an A/D conversion circuit, and a phasing summing circuit, for example. An amplifier is a circuit which amplifies a received signal at the predetermined amplification rate corresponding to each individual course for each channel. An A/D conversion circuit is a circuit for the A/D conversion of the amplified received signal. A phasing summing circuit is a circuit for arranging a time phase by adding a delay time to the A/D converted received signal for each individual course corresponding to each channel, and adding these (phasing summing), and forming a scan line data.

Image generation unit 44 generates 13 mode image data by carrying out envelope curve detection processing logarithmic amplification, etc. to the scan line data from Reception unit 43, and carrying out luminosity conversion by adjusting a dynamic range or a gain. That is, B mode image data expresses the strength of a received signal with luminosity. Image generation unit 44 may be a unit which can generate an image data based on other than B mode, such as A mode image data, M mode image data, and the Doppler method.

Memory unit 45 is constituted by semiconductor memory, for example, such as DRAM (Dynamic Random Access Memory), and memorizes the B mode image data transmitted from the Image generation unit 44 per flame. That is, it is memorizable as flame image data. The memorized flame image data is transmitted to DSC 46 according to control of Control unit 48.

DSC 46 changes the flame image data received from Memory unit 45 into the image signal by the scan mode of a television signal, and outputs it to Display unit 47.

As Display unit 47, applicable are display devices such as LCD (Liquid Crystal Display), CRT (Cathode-Ray Tube), organic electroluminescence (Electronic Luminescence) display, inorganic EL display, and a plasma display. Display unit 47 displays a picture on a display screen according to the image signal outputted from DSC 46. In addition, it may replace with a printing equipment such as a printer, instead of a display.

Control unit 48 comprises, for example, CPU (Central Processing Unit), ROM (Read Only Memory) and RAM (Random Access Memory). Various processing programs, such as a system program memorized by ROM, are read and expanded to RAM. According to the expanded program, the operation of each part of an ultrasound diagnostic apparatus S is centrally controlled.

ROM is constituted by nonvolatile memory, such as a semiconductor and memorizes a system program corresponding to ultrasound diagnostic apparatus S, various processing programs which can be executed on the system program, and various data. These programs are stored in the form of the program code which can be read by a computer, and CPU performs operation according to the program code concerned one by one.

RAM forms the work area which temporarily memorizes the various programs executed by CPU, and the data concerning these programs.

As described above, according to the embodiment of the present invention, the laminated piezoelectric material 1 (20) comprises 4n laminated layers, provided that one unit is constituted by four layer piezoelectric materials 2-5 (21-24) made of inorganic piezoelectric material as principal component, and resonances in mλ/2 resonance mode caused by thickness stretch of the piezoelectric materials 2-5 (21-24). The piezoelectric materials 2-5 (21-24) each has remanent polarization in thickness direction. The laminated piezoelectric material 1 (20) is laminated so that a direction of an electric field generated by applied voltage and a direction of the remanent polarization counters in only one of the piezoelectric material in four layer-piezoelectric materials 2 to 5 (21 to 24) and coincides with other three layers in the one unit, or the direction of the electric field and the direction of the remanent polarization coincides with only one of the piezoelectric material of four layer-piezoelectric materials and counters in other three layers in the one unit. As a result, a laminated piezoelectric material having high sensitivity in a high order frequency can be obtained. Further, since the strain of each piezoelectric material is not balanced between peaks, whereby there exists the wide frequency band which can be utilized the resonance of the laminated piezoelectric material, and it becomes practical.

Moreover, according to the embodiment of the present invention, the laminated piezoelectric material 1 is constituted so that the piezoelectric material 2 to 5 of each layer is connected in parallel electrically. As a result, since electric impedance can be lowered by decreasing capacity of capacitor, the influence of impedance matching with the system which controls excitation of a laminated piezoelectric material can be reduced.

Herein, the description in the embodiment of the present invention is an example of a laminated piezoelectric material, an ultrasound probe, and ultrasound diagnostic apparatus concerning this invention, and is not limited thereto. It can appropriately change also about the detail composition of each functional part and detail operation which constitute a laminated piezoelectric material, an ultrasound probe, and ultrasound diagnostic apparatus.

What is claimed is:

1. A laminated piezoelectric material comprising a four-layered piezoelectric material and electrode layers for applying a voltage to each layer of the four-layered piezoelectric material,
wherein each piezoelectric material of the four-layered piezoelectric material comprises an inorganic piezoelectric material as a principal component and has a remanent polarization in a thickness direction, and
the layer of the four-layered piezoelectric material is laminated so that,
a direction of an electric field counters to a direction of the remanent polarization in only one of the piezoelectric material of the four-layered piezoelectric material and the direction of the electric field coincides with the direction of the remanent polarization in other three layers, or
the direction of the electric field coincides with the direction of the remanent polarization in only one of the piezoelectric material of the four-layered piezoelectric material and the direction of the electric field counters to the direction of the remanent polarization in other three layers,
when the voltage is applied to each piezoelectric material of the four-layered piezoelectric material via the electrode layers.

2. A laminated piezoelectric material comprising integral multiple of the four-layered piezoelectric material of claim 1 which has the relation between the direction of the electric field and the direction of the remanent polarization.

3. The laminated piezoelectric material of claim 1 constituting so that the piezoelectric material of each layer is connected in parallel electrically.

4. An ultrasound probe, comprising:
the laminated piezoelectric material of claim 1, wherein the laminated piezoelectric material transmits transmission ultrasound wave towards a test object by applying a voltage to the laminated piezoelectric material, receives a reflective ultrasound wave from the test object and converts the reflective ultrasound wave into an electric signal.

5. An ultrasound diagnostic apparatus, comprising:
the ultrasound probe of claim 4,
a transmission unit which transmits a transmission signal to the ultrasound probe for applying the voltage to the laminated piezoelectric material,
a reception unit which receives an electric signal converted by the ultrasound probe as a reception signal,
an image generation unit which generates an ultrasound image data based on the reception signal received by the reception unit, and
a display unit which displays an ultrasound image based on the ultrasound image data generated by the image generation unit.

* * * * *